United States Patent [19]
Yamaguchi et al.

[11] Patent Number: 5,549,951
[45] Date of Patent: Aug. 27, 1996

[54] COMPOSITE ULTRAFINE PARTICLES OF NITRIDES, METHOD FOR PRODUCTION AND SINTERED ARTICLE THEREOF

[75] Inventors: Tadashi Yamaguchi, Sendai; Katsutoshi Nosaki, Wako; Inoue Akihisa; Tsuyoshi Masumoto, both of Sendai, all of Japan

[73] Assignees: YKK Corporation, Tokyo; Tsuyoshi Masumoto; Akihisa Inoue, both of Miyagi-ken; Honda Giken Kogyo Kabushiki Kaisha, Tokyo, all of Japan

[21] Appl. No.: 301,879

[22] Filed: Sep. 7, 1994

[30] Foreign Application Priority Data

| Sep. 8, 1993 | [JP] | Japan | 5-246064 |
| Sep. 29, 1993 | [JP] | Japan | 5-264104 |
| Mar. 28, 1994 | [JP] | Japan | 6-079282 |

[51] Int. Cl.$^6$ ........................ B22F 7/00
[52] U.S. Cl. ............... 428/565; 428/544; 428/546; 428/552; 428/570; 75/252; 75/255
[58] Field of Search ............... 428/544, 546, 428/551, 552, 565, 570; 75/255, 252

[56] References Cited

U.S. PATENT DOCUMENTS

| 4,594,101 | 6/1986 | Miura et al. | 75/252 |
| 4,619,699 | 10/1986 | Petrovic-Luton et al. | 75/252 |
| 4,689,075 | 8/1987 | Uda et al. | 75/5 B |
| 5,122,182 | 6/1992 | Dorfman et al. | 75/252 |
| 5,183,631 | 2/1993 | Kugimiya et al. | 419/10 |
| 5,436,080 | 7/1995 | Inoue et al. | 428/546 |

FOREIGN PATENT DOCUMENTS

| 0492563 | 7/1992 | European Pat. Off. |
| 0532000 | 3/1993 | European Pat. Off. |
| 62-279542 | 12/1987 | Japan |
| 62-282635 | 12/1987 | Japan |
| 62-283805 | 12/1987 | Japan |

*Primary Examiner*—Donald P. Walsh
*Assistant Examiner*—John N. Greaves
*Attorney, Agent, or Firm*—Finnegan, Henderson, Farabow, Garrett & Dunner, L.L.P.

[57] ABSTRACT

Ultrafine whiskery or columnar ceramic particles, a method for producing the ultrafine particles, and a sintered article obtained by sintering the ultrafine ceramic particles are disclosed. The ultrafine ceramic particles are produced by thermally melting a matrix alloy of a composition of Al—$M^1$, wherein $M^1$ stands for at least one metallic element selected from the group consisting of Cr, Co, and Fe, or Al—$M^1$—$M^2$, wherein $M^2$ stands for at least one metallic element selected from the group consisting of Au, Cu, Dy, Er, Ga, Ge, Gd, Hf, Ho, Lu, Mn, Mo, Nb, Nd, Ni, Pr, Re, Sb, Sc, Si, Sn, Ta, Tb, Ti, Tm, V, W, Y, Zn, or Zr, in a nitriding atmosphere containing nitrogen and causing the vaporized raw material to react with the nitrogen in the atmosphere. By this method, ultrafine composite particles or a mixture comprising ultrafine whiskery or columnar aluminum nitride particles and ultrafine particles of the metal, the intermetallic compound of the metal with aluminum, and the nitride ceramic of the metal are produced. The ultrafine particles thus obtained find extensive utility as sintering materials and dispersion materials, for example.

18 Claims, 14 Drawing Sheets

COMPOSITE ULTRAFINE PARTICLES OF NITRIDES, METHOD FOR PRODUCTION AND SINTERED ARTICLE THEREOF

BACKGROUND OF THE INVENTION

1. Field of the Invention

This invention relates to composite ultrafine particles of nitrides having a whiskery or columnar structure, a method for the production thereof, and a sintered article obtained by sintering a powder containing the ultrafine particles.

2. Description of the Prior Art

The sintered articles of metal nitrides such as, for example, aluminum nitride are widely used in various applications as to heat-releasing substrates for semi-conductors, printed circuit boards, packaging materials for LSI (large scale integrated circuit), light-pervious heat-resistant materials, etc. because they are possessed of resistance to heat, high thermal conductivity, high electrical insulating quality, and light transmission property. Though these sintered articles of metal nitrides are generally produced by sintering a nitride powder, the properties of the sintered articles thus obtained are appreciably affected by the purity and the particle diameter of a particular powder used as the raw material. The production of a sintered article of high performance, therefore, necessitates the use of a very fine nitride powder of high purity. When such fine ceramic particles are used as a dispersive reinforcing material in a particle-dispersed composite material, they are desired to be very slender particles having a whiskery or columnar structure.

In the production of such ultrafine particles of a metal nitride as mentioned above by the arc plasma method, for example, it is difficult to obtain the ultrafine nitride particles unless the nitride uses such a metal as titanium or zirconium which has strong affinity for nitrogen. The ultrafine particles of TiN or ZrN, however, are at a disadvantage in being producible only in an extremely low yield (about 10 mg/min.).

When aluminum or chromium reputed to produce ultrafine nitride particles in a relatively high yield is used as a vaporizing material, all the produced particles are not nitrided; they are nitrided only up to about 30% in the case of aluminum or about 40% in the case of chromium. Thus, ultrafine particles containing metal and ceramic phases (Al+30% AlN or Cr+40% β—$Cr_2N$) are produced.

In view of this destitution, a method for producing a very fine aluminum nitride powder by melting metallic aluminum with an arc or plasma in the atmosphere of a mixed gas consisting of nitrogen and ammonia thereby preparing a very fine mixed powder of metallic aluminum and aluminum nitride and subsequently heating the mixed powder at a high temperature in an atmosphere of nitrogen thereby nitriding the very fine metallic aluminum powder has been proposed (see Japanese Patent Applications, KOKAI (Early Publication) No. 62-283,805 and No. 62-282,635).

This method, however, also has the problem of being incapable of obtaining a sintered article of aluminum nitride of high performance because the produced powder is not wholly nitrided and further because the portion of the very fine metallic aluminum powder which has escaped being nitrided is extremely active and is ignited or oxidized with even a small amount of oxygen. Besides, the produced aluminum nitride particles have relatively isotropic forms such as hexagons or spheres. When this powder is manufactured into a sintered article or it is used as a reinforcing material in the production of a composite material having a metallic matrix, therefore, the sintered article or the composite material has room for further improvement in strength, particularly hot strength.

The production of ultrafine particles by mixing two kinds (metallic aluminum and aluminum nitride) of ultrafine particles having a particle diameter of a micron order in a gaseous phase has been known to the art. The production of composite ultrafine particles having a particle diameter of a nm order by compounding a metal with aluminum nitride has been virtually unknown to the art.

SUMMARY OF THE INVENTION

The present invention has been produced for the purpose of solving the problems attendant on the conventional techniques as described above and, at the same time, accomplishing the production of ultrafine ceramic particles of a whiskery or columnar structure having a particle diameter of a nm order and, owing to the use of the ultrafine ceramic particles, permitting the production of a sintered article or ultrafine ceramic particles-containing composite material which excels in hot strength.

The fundamental object of the present invention is to find the composition of a raw material for and the conditions for the production of ultrafine ceramic particles of a whiskeryor columnar structure having a particle diameter of a nm order.

A further object of the present invention is to find the composition of a raw material for and the conditions for the production of composite ultrafine particles having a particle diameter of a nm order and obtained by compounding ultrafine particles of a metal, intermetallic compound, or ceramic substance with ultrafine aluminum nitride particles of a whiskery or columnar structure.

Another object of the present invention consists in permitting the production with high productivity of ultrafine ceramic particles which contain ultrafine nitride particles of a whiskery or columnar structure, which are usable in their unmodified form as a blasting powder and also usable as magnetic materials or other functional materials, and which can be used highly advantageously for the production of sintered articles and metallic matrix composite materials of high quality.

Still another object of the present invention is to provide sintered articles and metallic matrix composite materials which, owing to the use of the ultrafine ceramic particles mentioned above as a sintering material or whisker dispersing material, excel in hot strength, resistance to heat, hardness, etc.

To accomplish the objects described above, the present invention provides a method for the production of ultrafine nitride particles, which comprises thermally melting a raw material consisting of aluminum and an $M^1$ element, wherein $M^1$ stands for at least one metallic element selected from the group consisting of Cr, Co, and Fe, or raw material consisting of aluminum, an $M^1$ element and an $M^2$ element, wherein $M^1$ has the same meaning as defined above and $M^2$ stands for at least one metallic element selected from the group consisting of Au, Cu, Dy, Er, Ga, Ge, Gd, Hf, Ho, Lu, Mn, Mo, Nb, Nd, Ni, Pr, Re, Sb, Sc, Si, Sn, Ta, Tb, Ti, Tm, V, W, Y, Zn, and Zr, in a nitriding atmosphere containing nitrogen and causing the vaporized material to react with nitrogen in the atmosphere thereby producing ultrafine particles of aluminum nitride compounded with a metal, intermetallic compound, or nitride ceramic.

In accordance with the method of the present invention, ultrafine particles of a diameter of a nm order which contain a large amount of composite ultrafine particles formed of a composite phase of aluminum nitride with a metal, intermetallic compound or nitride ceramic and possessed of the structure having whiskery or columnar aluminum nitride extended from ultrafine particles of the metal, intermetallic compound or nitride ceramic are produced by using as the raw material therefor an alloy comprising from 5 to 95 atomic % of aluminum and from 5 to 95 atomic % of the $M^1$ element, wherein $M^1$ has the same meaning as defined above, preferably from 25 to 75 atomic % of aluminum and from 25 to 75 atomic % of the $M^1$ element or an alloy comprising from 5 to 45 atomic % of aluminum, from 5 to 45 atomic % of the $M^1$ element, and from 10 to 90 atomic % of the $M^2$ element, wherein $M^2$ has the same meaning as defined above. Under the particular conditions for the production, there may be produced a mixture of ultrafine particles of a metal, intermetallic compound, or nitride ceramic and ultrafine aluminum particles in the shape of whiskers or columns.

The ultrafine ceramic particles which are consequently produced excel in the sintering property because they possess a whiskery or columnar structure. When these ultrafine particles are sintered, therefore, they are enabled to acquire an exalted sintering density and give rise to a sintered article of high quality. Further, they can be used as a reinforcing material for metal matrix composite materials and can be widely used for blasting powder, magnetic materials, and other functional materials.

BRIEF DESCRIPTION OF THE DRAWINGS

The other objects, features, and advantages of the present invention will become apparent from the following description taken together with the drawings, in which.

DETAILED DESCRIPTION OF THE INVENTION

Figure 1:
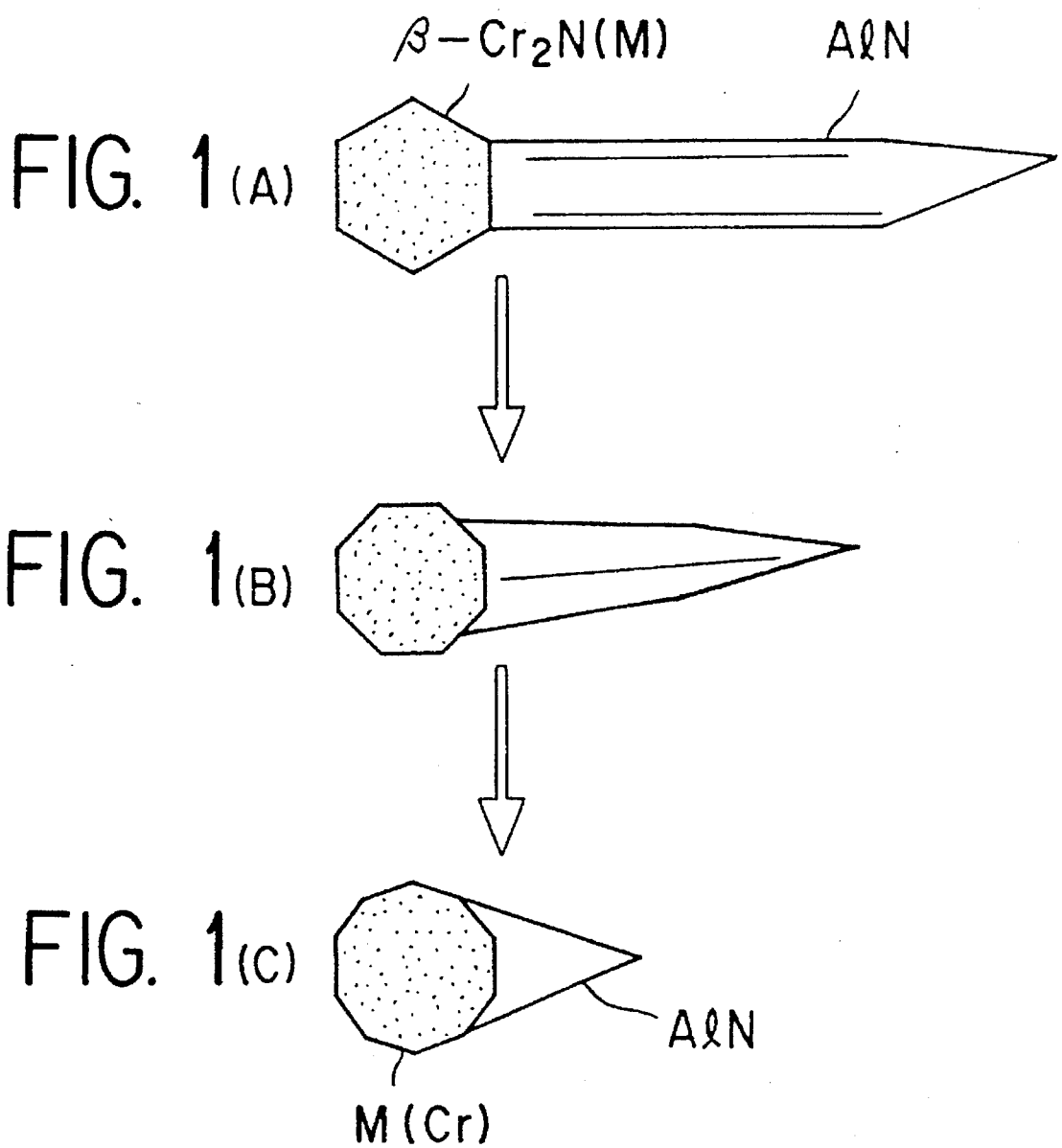
FIGS. 1(a), 1(b), and 1(c) are model diagrams schematically illustrating the structures of ultrafine particles produced by the use of Al—Cr—M ternary alloys varied in composition under the same conditions.

The present inventors have made a diligent study with a view to attaining the objects described above and, as a result, have found that in the production of ultrafine nitride particles by the melting of a relevant alloy as by an arc, ultrafine aluminum nitride particles having a whiskery or columnar structure and a particle diameter of a nm order are produced by using an atmosphere formed of nitrogen gas and also using as a matrix alloy to be melted as by an arc an alloy of aluminum with other metallic element $M^1$ ($M^1$=Cr, Co, Fe) optionally further incorporating therein a metallic element represented by the aforementioned reference symbol $M^2$. They have further found that ultrafine composite nitride particles formed of a composite phase of aluminum nitride with a metal, intermetallic compound, or nitride ceramic and containing substantially no ultrafine particle of any elementary metal are produced by suitably selecting the composition of the alloy mentioned above, the partial pressure of nitrogen, etc.

Specifically, the present invention is characterized by using, as a matrix alloy to be melted as by an arc in the production of ultrafine particles, an alloy of aluminum with other metallic element $M^1$ ($M^1$=Cr, Co, Fe) optionally further incorporating therein a metallic element represented by the aforementioned reference symbol $M^2$ and using nitrogen gas in the preparation of an atmosphere for nitridation and consequently allowing ultrafine ceramic particles of a whiskery or columnar structure to be produced in a high yield in a gaseous phase.

As concrete examples of the thermal melting method mentioned above, the arc melting method, high-frequency thermal melting method, plasma jet heating method, high-frequency induction heating (high-frequency plasma heating) method, electron beam heating method, and laser beam heating method are advantageously usable.

In accordance with the present invention, ultrafine particles containing a large amount of ultrafine composite nitride particles of the structure having a whiskery or columnar aluminum nitride extended from an ultrafine particle of nitride ceramic ($\beta$—$Cr_2N$), intermetallic compound (Al—Cr system, Al—Co system, Al—Fe system), or metal (Co or $\alpha$—Fe) are obtained by using a binary alloy composed of aluminum with chromium, cobalt, or iron as the matrix alloy. Further, by using an Al—$M^1$—$M^1$ ternary alloy, wherein $M^1$—$M^1$ stands for the union of two elements selected from among Cr, Co, and Fe, there can be obtained ultrafine nitride particles which contain a large amount of ultrafine composite nitride particles of the structure having the whiskery or columnar aluminum nitride extended from the ultrafine particle of metal (Co or $\alpha$-Fe), intermetallic compound, or nitride ceramic ($\beta$-$Cr_2N$) depending on the composition of alloy used. This remark holds good for the aforementioned Al—$M^1$—$M^2$ alloy.

The ultrafine composite nitride particles of the structure having the whiskery or columnar aluminum nitride extended from the ultrafine particle of a metal, intermetallic compound, or nitride ceramic are produced by using a binary alloy of the Al—$M^1$ system ($M^1$=Cr, Co, or Fe) or a ternary alloy of the Al—$M^1$—$M^1$ system, wherein $M^1$—$M^1$ stands for the union of two elements selected from among Cr, Co, and Fe, as an evaporation source. In case other $M^2$ metallic element is used, the composite ultrafine particles of the structure mentioned above cannot be produced from a binary alloy of the Al—$M^2$ system. From a ternary alloy of the Al—$M^1$—$M^2$ system, however, ultrafine particles having the same structure as that of composite ultrafine particles of the Al—$M^1$ system or Al—$M^1$—$M^1$ system can be produced. This difference may be logically explained by a supposition that the $M^2$ element is capable of forming a solid solution in the $M^1$ element such as, for example, Cr or Cr is capable of forming a solid solution in the $M^2$ element. As concrete examples of the $M^2$ element satisfying the requirement mentioned above, Au, Cu, Dy, Er, Ga, Ge, Gd, Hf, Ho, Lu, Mn, Mo, Nb, Nd, Ni, Pr, Re, Sb, Sc, Si, Sn, Ta, Tb, Ti, Tm, V, W, Y, Zn, and Zr may be cited. Ni, Mn, and V are capable of easily producing composite ultrafine particles among other elements cited above.

As the matrix alloy of the Al—$M^1$ ($M^1$=Cr, Co, Fe) system, the binary alloy composed of from 5 to 75 atomic % aluminum and from 25 to 95 atomic % $M^1$ metallic element, preferably from 25 to 75 atomic % aluminum and from 25 to 75 atomic % $M^1$ metallic element, and the ternary alloy composed of from 5 to 95 atomic % aluminum and from 5 to 95 atomic % $M^1$ metallic elements (providing $M^1$ stands for at least two metallic elements selected from among Cr, Co, and Fe), preferably from 10 to 90 atomic % aluminum and 10 to 90 atomic % $M^1$ metallic elements are used. If the aluminum content exceeds 75 atomic % in the binary alloy or 95 atomic % in the ternary alloy, the disadvantage ensues that the ease with which ultrafine particles of metallic aluminum are produced unduly grows as clearly noted from the examples to be cited hereinafter. Conversely, if the aluminum content is less than 25 atomic % in the binary alloy or less than 5 atomic % in the ternary alloy, the difficulty with which the whiskery or columnar aluminum nitride particles are produced tends to increase. The Al—$M^1$—$M^2$ ternary alloy ($M^1$ =Cr, Co, or Fe and $M^2$ =Au, Cu, Dy, Er, Ga, Ge, Gd, Hf, Ho, Lu, Mn, Mo, Nb, Nd, Ni, Pr, Re, Sb, Sc, Si, Sn, Ta, Tb, Ti, Tm, V, W, Y, Zn, or Zr) comprises from 5 to 45 atomic % aluminum, from 5 to 45 atomic % $M^1$ metallic element, and from 10 to 90 atomic % $M^2$ metallic element.

The question whether the produced ultrafine nitride particles mainly comprise ultrafine composite nitride particles of the structure having a whiskery or columnar aluminum nitride extended from an ultrafine particle of a metal, intermetallic compound, or nitride ceramic or a mixture of ultrafine particles of a metal, intermetallic compound, or nitride ceramic and ultrafine whiskery or columnar aluminum nitride particles is greatly affected by the kind and composition of the matrix alloy to be used. Further, the structure of the produced ultrafine particles depends on the kind and composition of the matrix alloy to be used. It suffices, therefore, to select the kind and composition of the matrix alloy within the respective ranges specified above, depending on the particular ultrafine nitride particles desired to be obtained.

By using an Al—Cr alloy composed of from 5 to 75 atomic % aluminum and from 25 to 95 atomic % chromium as the matrix alloy, for example, ultrafine Al—Cr—N nitride particles which contain no ultrafine particle of metal and comprise a mixture formed discretely of ultrafine chromium nitride ($\beta$—$Cr_2N$) particles and ultrafine whiskery or columnar aluminum nitride (AlN) particles can be produced. If the chromium content is less than 40 atomic % and the aluminum content exceeds 60 atomic %, an intermetallic compound of aluminum and chromium is formed and ultrafine particles of metallic aluminum are readily produced as clearly noted from the examples to be cited hereinafter. Conversely, if the aluminum content is less than 5 atomic % and the chromium content exceeds 95 atomic %, the disadvantage arises that ultrafine particles of metallic chromium will readily occur. When an Al—Cr alloy composed of from 25 to 60 atomic % aluminum and from 40 to 75 atomic % chromium is used as the matrix alloy, ultrafine composite Al—Cr—N nitride particles formed of a composite phase of aluminum nitride and chromium nitride and possessed of the structure having a minute whiskery or columnar aluminum nitride particle extended from an ultrafine chromium nitride particle are produced. Within the overlapping part of the ranges of composition mentioned above, the question of which of the two structures mentioned above is mainly assumed by the produced ultrafine particles hinges on the conditions of production such as, for example, the partial pressure of nitrogen.

Now, therefore, the structures of the ultrafine particles produced with ternary Al—Cr—M (Fe or Co) alloys varied in composition under fixed conditions of production will be described below with reference to the model diagram of FIG. 1. When the matrix alloy has a small content of M element (as in the case of $Al_{45}Cr_{45}Fe(or\ Co)_{10}$, for example), composite ultrafine particles of the structure having a head part of particle formed of a solid solution of the M element (Fe or Co) in $\beta$—$Cr_2N$ and a whiskery or columnar leg part thereof formed of AlN and extended from the head part as shown in FIG. 1 (A) are obtained. When the matrix alloy conversely has a large content of M element (as in the case of $Al_{10}Cr_{10}Fe(or\ Co)_{80}$, for example), composite ultrafine particles of the structure having a head part of particle formed of a solid solution of Cr in a metal M ($\alpha$—Fe or Co) or a nitride (MN) or an Al—Cr intermetallic compound (in the case of Al—Cr—Fe system, for example) and an acicular or acutely columnar leg part thereof formed of AlN and extended from the head part as shown in FIG. 1 (C) are obtained. When the content of the M element in the matrix alloy is intermediate between those of the two compositions mentioned above (as in the case of $Al_{30}Cr_{30}Fe(\text{or Co})_{40}$, for example), ultrafine particles of the structure which is an intermediate between the structures of the composite ultrafine particles of (A) and the composite ultrafine particles of (C) as shown in FIG. 1 (B) are obtained. Thus, the aluminum nitride leg part of particle changes from a whiskery or columnar shape to a relatively thick acicular or acutely columnar shape and the head part of particle changes from a ceramic to a metallic texture and from an angular polyhedral shape to a roundish shape and further tends to grow in volume in proportion as the content of the M element increases and the content of Al and that of Cr decrease. In the case of composite ultrafine particles obtained with a binary alloy of a composition of Al—Fe or —Co, the AlN leg part assumes a shape resembling a rod and the particle as a whole assumes a shape resembling a match. These composite ultrafine particles show the tendency to acquire longer whiskery or columnar leg parts when they are produced with the matrix alloy of the Al—(Cr)—Fe system than when they are produced with that of the Al—(Cr)—Co system. When an Al—Cr—$M^2$ ternary alloy is used, the composite ultrafine particles are formed in a shape which is variable with the particular kind of the $M^2$ element. Composite ultrafine particles having the shape of a short match are produced with an Al—Cr—Ni alloy, those having the leg part in the shape of nail with an Al—Cr—Mn alloy, and those having the leg part in an acicular shape with an Al—Cr—V alloy.

The composite ultrafine particles which are obtained as described above have sizes such that the head parts thereof measure in the approximate range of from 10 to 500 nm and the leg parts thereof in the approximate range of from 50 to 1,000 nm. The leg parts of the particles may have their length adjusted by varying the composition of the matrix alloy or varying the content of aluminum in the matrix alloy.

The mechanism which permits the formation of such whiskery or columnar aluminum nitride particles as mentioned above remains yet to be elucidated. The occurrence of these particular particles is not observed in the production of ultrafine particles from metallic elementary aluminum. Thus, their occurrence may be logically explained by a supposition that these particular particles have grown from the aforementioned metal, intermetallic compound, or ceramic which serves as seed crystals.

When the ultrafine ceramic particles having such a whiskery or columnar structure as described above are utilized in the production of a sintered article or metal-based composite material, they will assume an intertwined structure and contribute to impart improved strength to the product. To manifest this effect, therefore, the ultrafine particles to be used are required to contain at least 5% by volume of ultrafine aluminum nitride particles of the whiskery or columnar structure.

The volumetric ratio of the ultrafine aluminum nitride particles of the whiskery or columnar structure in the produced ultrafine particles can be controlled by varying the composition of the matrix alloy mentioned above or, in the case of efficient production of the ultrafine particles, by varying the pressure of the atmosphere formed of nitrogen gas or the partial pressure of nitrogen in the atmospheric gas in the range of from 50 to 760 Torr.

Incidentally, the matrix alloy is desired to be prepared in an atmosphere of an inert gas before it is melted in the atmosphere of nitrogen. Optionally, however, this matrix alloy may be melted in a vacuum within the same vessel that is to be used subsequently for melting the alloy in the atmosphere of nitrogen or it may be melted in a separate vacuum vessel before it is melted in the atmosphere of nitrogen.

The production of a sintered article can be carried out under suitable conditions depending on the composition, shape, and quality of the produced ultrafine nitride particles. In the case of the ultrafine particles which have been produced with an Al—Cr—M matrix alloy, for example, the sintering temperature is desired to be in the approximate range of from 1,500° to 1,800° C. when AlN or β—$Cr_2N$ forms the main phase of the particles. The sintering is carried out in the atmosphere of nitrogen to permit manufacture of a sintered article of an AlN-β—$Cr_2N$ ceramic. When the metal M (α—Fe, Ni, etc.) forms the main phase, the sintering temperature is desired to be in the approximate range of from 1,000° to 1,300° C. and the sintering is carried out in a vacuum. As a result, a sintered article of an AlN-dispersed metal can be produced.

The ultrafine particles which are obtained by the present invention can be advantageously used (A) as a blasting powder for fine fabrication of the surface of a varying substance and (B) for a novel process of fabrication to be used in the manufacture of a varying micromachine, for example, fabrication of substrates for electronic materials, fabrication of ultra-micro parts, and fine surface treatments.

Specifically, the ultrafine particles according to the present invention contain ultrafine whiskery or columnar aluminum nitride particles. Particularly, in the composite ultrafine particles, the aluminum nitride projecting from the particulate head part of a metal, intermetallic compound, or ceramic is pointed and the particles themselves have diameters of a nm order. Thus, the ultrafine particles according to the present invention may be suitably used as the blasting powder. The ultrafine particles can be spouted against a given workpiece such as, for example, a metallic, ceramic, and plastic substrate with a carrier gas of high pressure such as, for example, Ar, $N_2$, and Ar+$N_2$. The accuracy with which the workpiece is consequently processed can be exalted even to a μm order by decreasing the diameter of the orifice of a nozzle to be used for spouting the particles. They even allow impartation of a desired pattern to the surface of a given substrate or permit insertion of a desired incision in a finely processed film deposited as a coating on a substrate. In the case of a substrate having a copper coating formed on the surface of a ceramic substance, for example, the part of the copper coating from which a pattern is removed by the blasting (the etched part) can be used as an electrical insulating part. This particular fabrication is useful for the applications of the category (B) mentioned above.

Further, the composite ultrafine particles of the present invention exhibit piezoelectricity. Particularly when the head parts of the composite ultrafine particles are formed of such a magnetic substance as α—Fe or Co, these particles can be parallelly arranged by means of a magnet on a substrate so that the head parts thereof may be directed downwardly and the leg parts thereof upwardly. They find utility, therefore, in piezoelectric materials.

Further, in the composite ultrafine particles of the present invention such as, for example, the ultrafine metal-nitride composite particles, metal particle and nitride ceramic particle are joined on a nm order. The composite ultrafine particles of the type using the combination of magnetic substance (metal)—nonmagnetic substance (ceramic) find utility in sensors and switches by virtue of their magnetic properties. When these composite ultrafine particles have their orientation changed by the use of an external magnetic field so that the head parts-leg parts thereof may be parallelly arranged, for example, the particles acquire no electric conductivity in the direction of from the head parts (metal) to the leg parts (ceramic) thereof or vice versa but acquire electric conductivity in the direction having the adjacent head parts (metal) thereof interconnected. Thus, the presence or absence of electric conductivity in these composite ultrafine particles can be freely changed by means of an external magnetic field. Further, the intensity of magnetization of these composite ultrafine particles can be arbitrarily changed by varying the content of such metal as Fe, Co, Ni, etc. in the ultrafine particles.

Now, the present invention will be explained more specifically below with reference to working examples.

Figure 2:
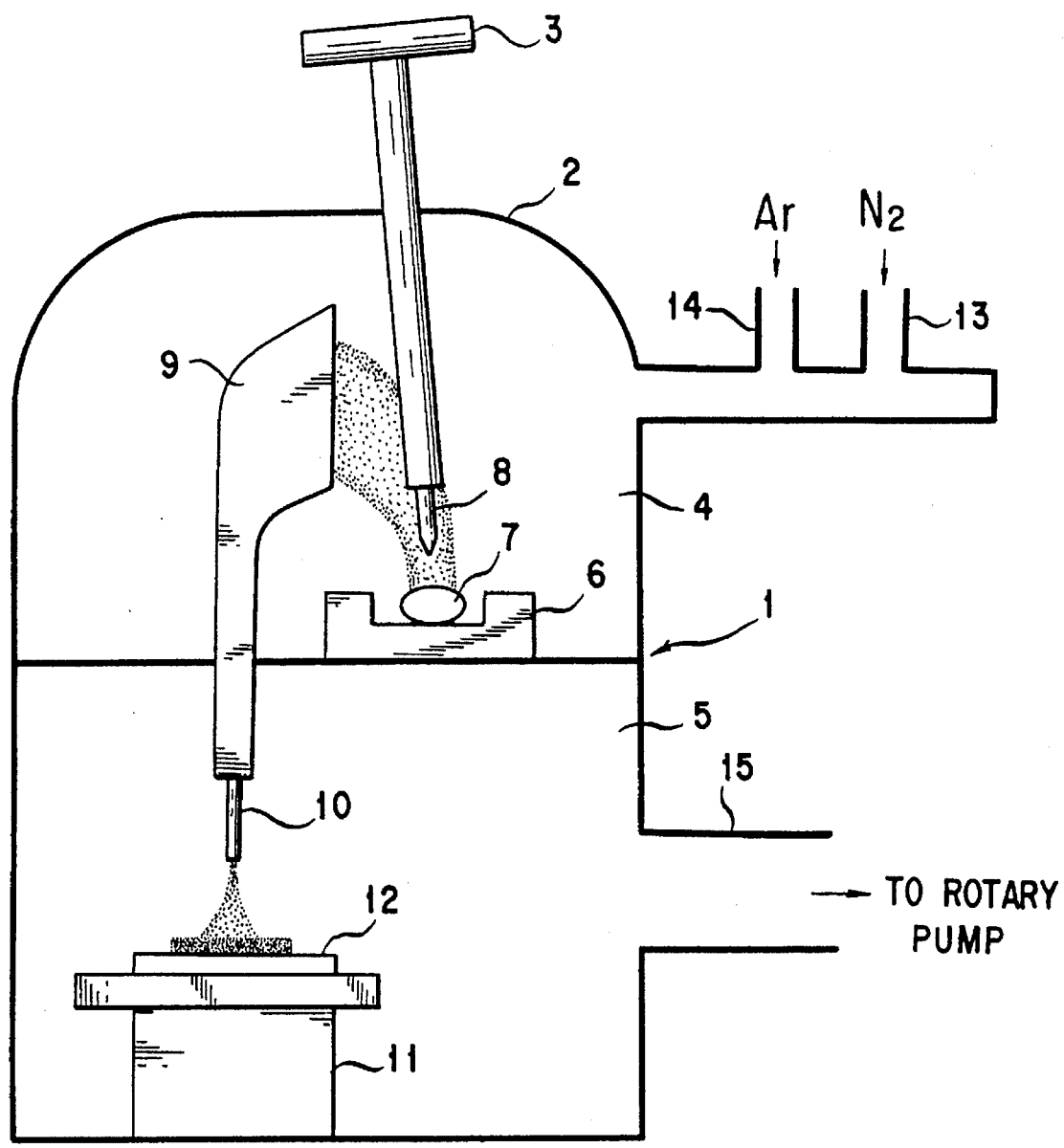
FIG. 2 is a schematic diagram illustrating one example of the construction of an apparatus to be used for the production of composite ultrafine particles by the arc melting technique in accordance with the method of the present invention.

FIG. 2 is a schematic structural diagram illustrating one example of an apparatus 1 to be used for the production of composite ultrafine particles by the arc melting in accordance with the method of the present invention, as adopted in the following working examples. In FIG. 2, the reference numeral 2 stands for a vacuum vessel and 3 for an arc electric source. The vacuum vessel 2 is divided into two compartments; an upper chamber 4 and a lower chamber 5. A matrix alloy 7 disposed in a hearth 6 inside the upper chamber 4 is melted by an electric arc and allowed to produce ultrafine particles. The ultrafine particles thus produced are collected by the stream of gas in a collection umbrella 9, forwarded through a nozzle 10, and deposited on a substrate 12 disposed on the upper side of a substrate stage part 11. The reference numerals 13, 14, and 15 respectively stand for a nitrogen gas inlet, an argon gas inlet, and a gas outlet.

One example of the procedure adopted for the production of ultrafine nitride particles by the use of the apparatus 1 shown in FIG. 2 will be described. First, the valves (not shown) of the nitrogen gas inlet 13 and the argon gas inlet 14 are closed and the upper chamber 4 and the lower chamber 5 are evacuated through the gas outlet 15 until the inner pressure of the upper and lower chambers 4 and 5 falls to a level in the approximate range of from $10^{-3}$ to $10^{-4}$ Torr. Then, nitrogen gas and argon gas are introduced respectively via the gas inlets 13 and 14 into the upper chamber 4 and the valve (not shown) of the gas outlet 15 is slightly opened to resume the evacuation of the lower chamber 5. At this time, the amounts of the nitrogen gas and the argon gas to be introduced through the gas inlets 13 and 14 and the amount of exhaust gas removed through the gas outlet 15 are so adjusted that the inner pressure of the upper chamber 4 may be maintained at a fixed partial pressure of nitrogen. With the inner gas pressure of the upper chamber 4 maintained at the fixed level, an arc electrode 8 is set discharging an arc to effect thermal melting of the matrix alloy 7 with a fixed arc current. The ultrafine particles generating from the molten matrix alloy 7 are entrained by the flow of gas through a collection umbrella 9 and blown out of the nozzle 10 and deposited on the substrate 12.

EXAMPLE 1

A binary alloy of a composition of 50 at% aluminum-50 at% chromium as a matrix alloy was melted with an arc (DC 200 A) in an atmosphere consisting of nitrogen and containing 4% of $H_2$ (with the partial pressure of nitrogen set at 300 Torr) to produce composite ultrafine particles comprising aluminum nitride and chromium nitride. The nitrogen gas was fed at a flow rate of 10 liters per minute during the process of arc melting. The produced ultrafine particles were deposited by the flow of the gas on a substrate in a high yield (about 100 mg/min.). The matrix alloy used herein had been obtained by melting aluminum and chromium with an arc and homogeneously alloying the melt in an atmosphere of argon within the same vacuum vessel as used for the production of ultrafine particles in the nitrogen atmosphere.

Ultrafine particles were produced by repeating the procedure described above while using binary alloys of compositions of 25 at% Al-75 at% Cr and 75 at% Al-25 at% Cr, metallic aluminum, and metallic chromium severally as matrix alloys instead.

Figure 3:
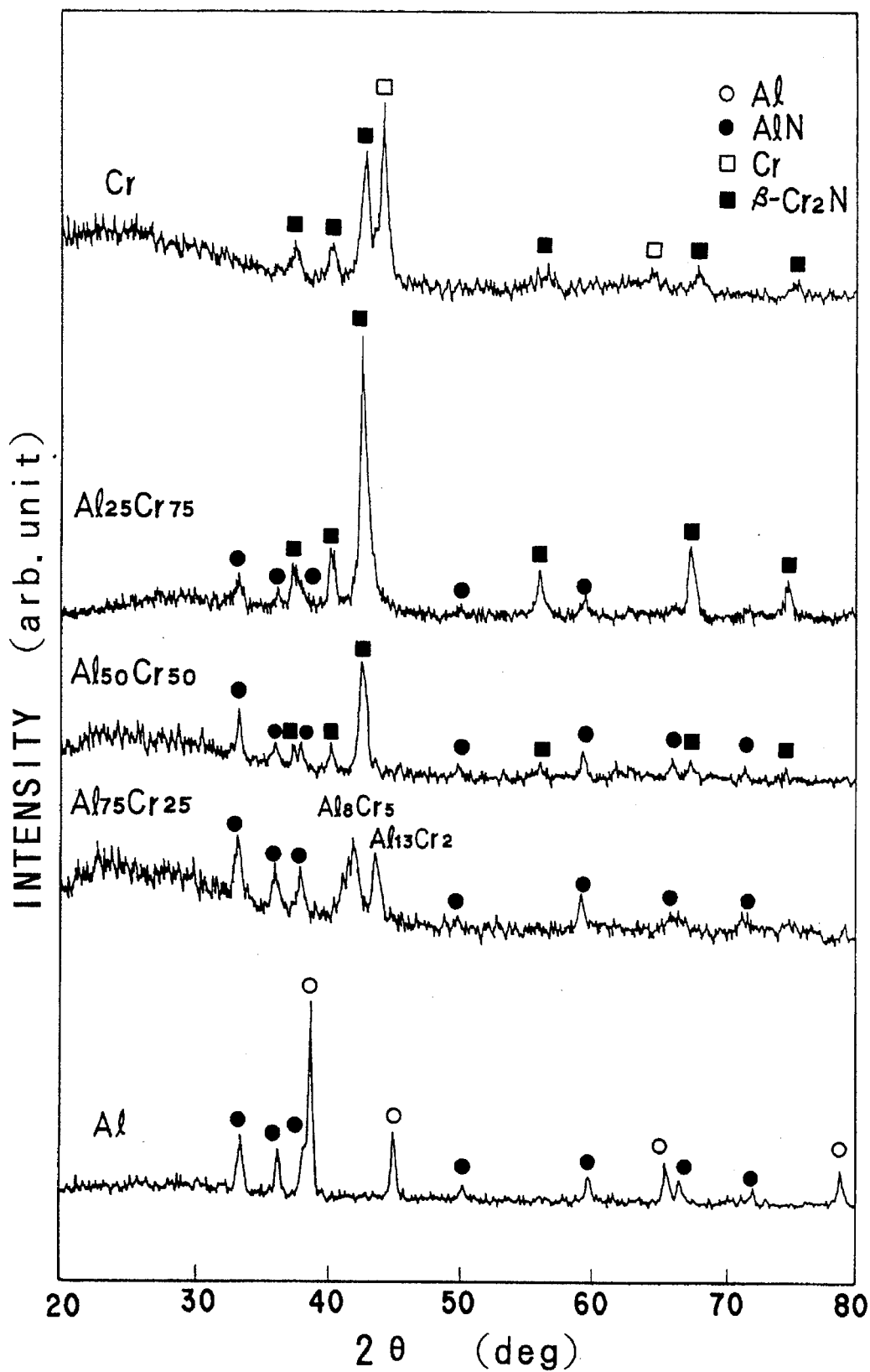
FIG. 3 is a diagram showing X-ray diffraction patterns of various ultrafine particles produced by using an aluminum-chromium binary alloys in varying compositions, metallic aluminum, and metallic chromium, as shifted in the direction of the vertical axis (intensity)

FIG. 3 is a diagram illustrating X-ray diffraction patterns of the ultrafine particles so produced. It is clearly noted from FIG. 3 that the ultrafine particles produced with the two binary alloys of 25 at% Al-75 at% Cr and 50 at% Al-50 at% Cr as the matrix alloys were both ultrafine nitride particles of β—$Cr_2N$ and AlN containing virtually no ultrafine metal particle. The product particularly from the matrix alloy of the composition of 25 at% Al-75 at% Cr was identified by the X-ray diffraction analysis to be ultrafine ceramic particles containing about 90% of β—$Cr_2N$. In contrast, the ultrafine particles produced from the matrix alloy of the composition of 75 at% Al-25 at% Cr were found to contain intermetallic compounds ($Al_8Cr_5$ and $Al_{13}Cr_2$).

Figure 4:
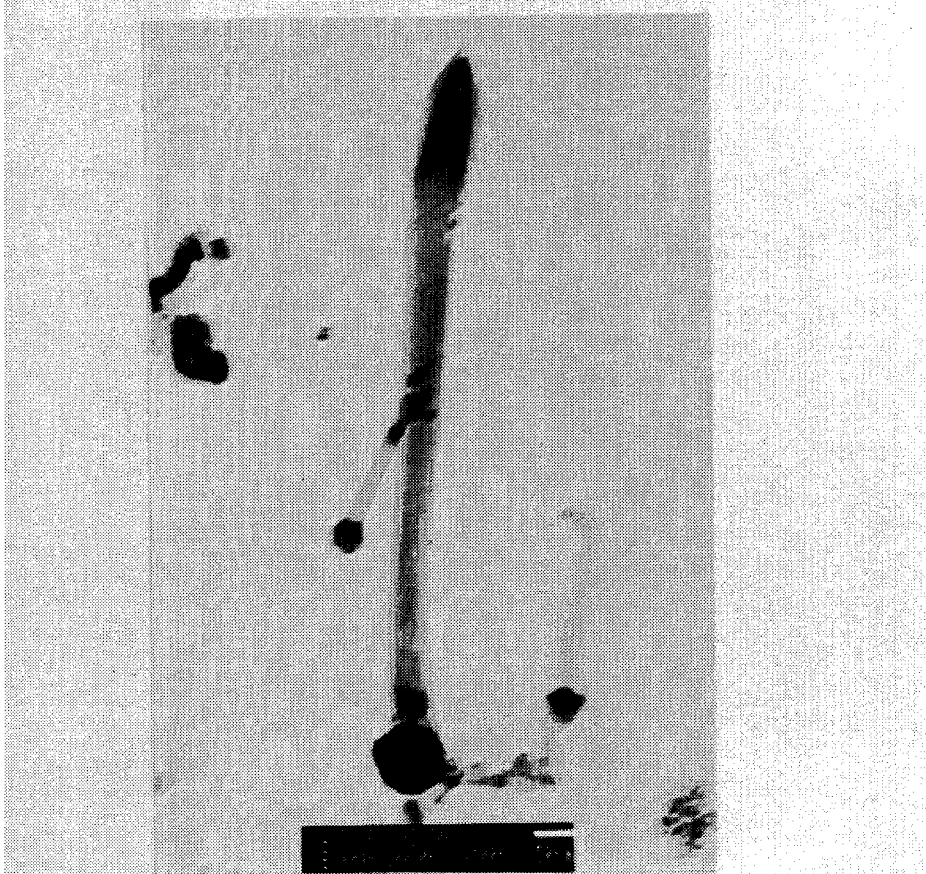
FIG. 4 is a transmission electron micrograph showing one of the composite ultrafine particles produced by the use of a 50 at% Al-50 at% Cr binary alloy.

FIG. 4 is a transmission electron micrograph showing one of the ultrafine particles produced with the binary alloy of the composition of 50 at% Al-50 at% Cr mentioned above. It is clearly noted from the photograph that from the matrix alloy of the composition of 50 at% Al-50 at% Cr were produced ultrafine particles containing a large amount of ultrafine particles of the shape of very slender ceramic whiskers measuring approximately from 20 to 80 nm in diameter and 1 μm in length. These ceramic whiskers, on analysis, were found to comprise composite ultrafine particles of the structure having an ultrafine whiskery AlN particle extended from an ultrafine β—$Cr_2N$ particle.

EXAMPLE 2

Ultrafine particles were produced with a ternary alloy of a composition of 25 at% aluminum-25 at% chromium-50 at% cobalt as a matrix alloy by following the procedure of Example 1, namely by subjecting the matrix alloy to the arc melting (DC 200 A) in the atmosphere of nitrogen gas containing 4% of $H_2$ (with the partial pressure of nitrogen set at 300 Torr). The matrix alloy used herein had been obtained by melting aluminum, chromium, and cobalt with an arc and homogeneously alloying the melt in an atmosphere of argon within the same vacuum vessel as used for the production of ultrafine particles in the nitrogen atmosphere.

Ultrafine particles were similarly produced with ternary alloys of compositions of 40 at% Al-40 at% Cr-20 at% Co and 45 at% Al-45 at% Cr-10 at% Co as matrix alloys.

Figure 5:
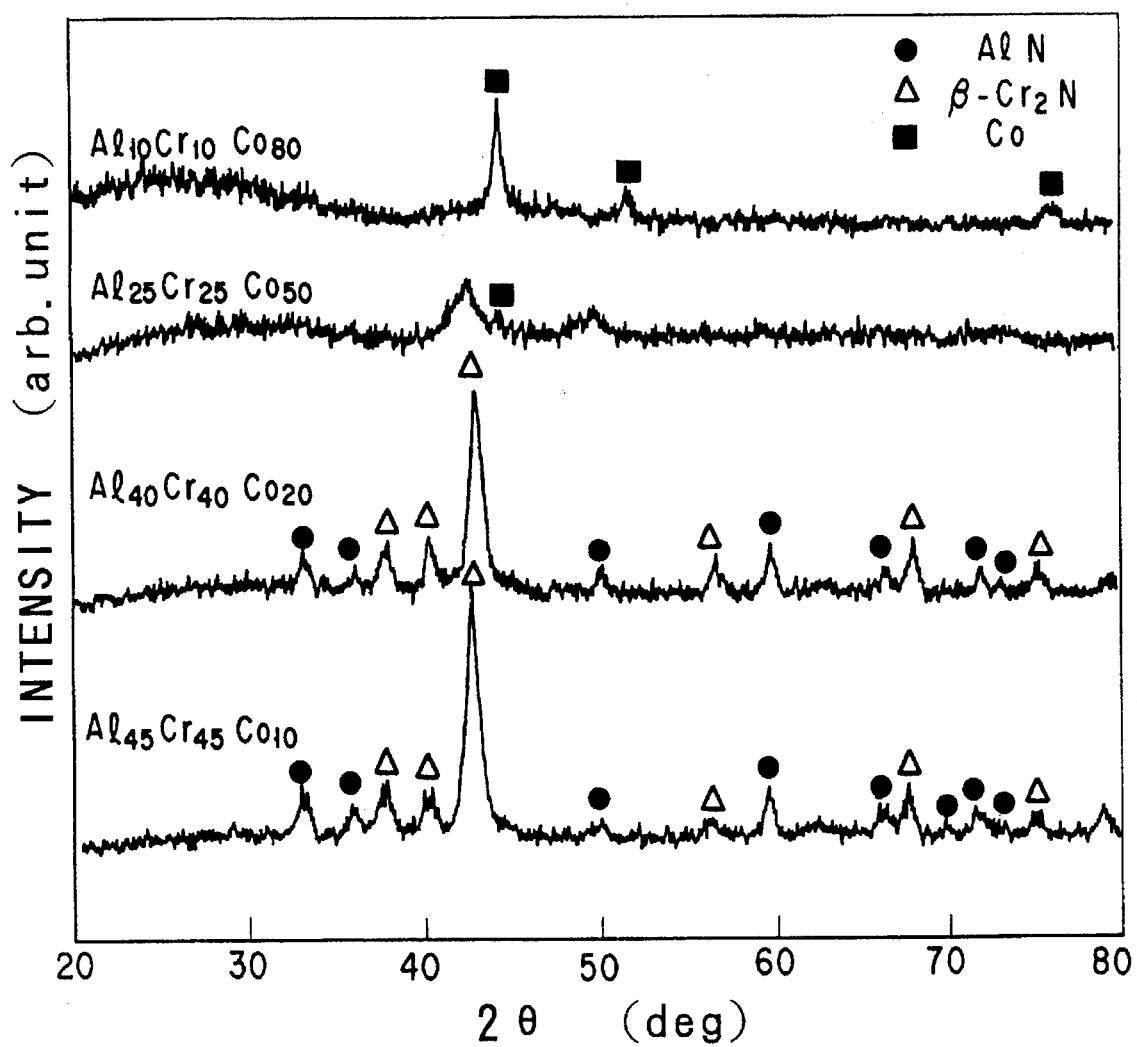
FIG. 5 is a diagram showing X-ray diffraction patterns of various ultrafine particles produced by the use of aluminum-chromium-cobalt ternary alloys varied in composition, as shifted in the direction of the vertical axis (intensity)

FIG. 5 shows the X-ray diffraction patterns of the ultrafine particles produced as described above, as shifted in the direction of the vertical axis (intensity). It is clearly noted from FIG. 5 that the ultrafine particles produced from the Al—Cr—Co ternary alloys as matrix alloys were ultrafine nitride particles of β—$Cr_2N$ (Co solid solution) and AlN.

Figure 6:
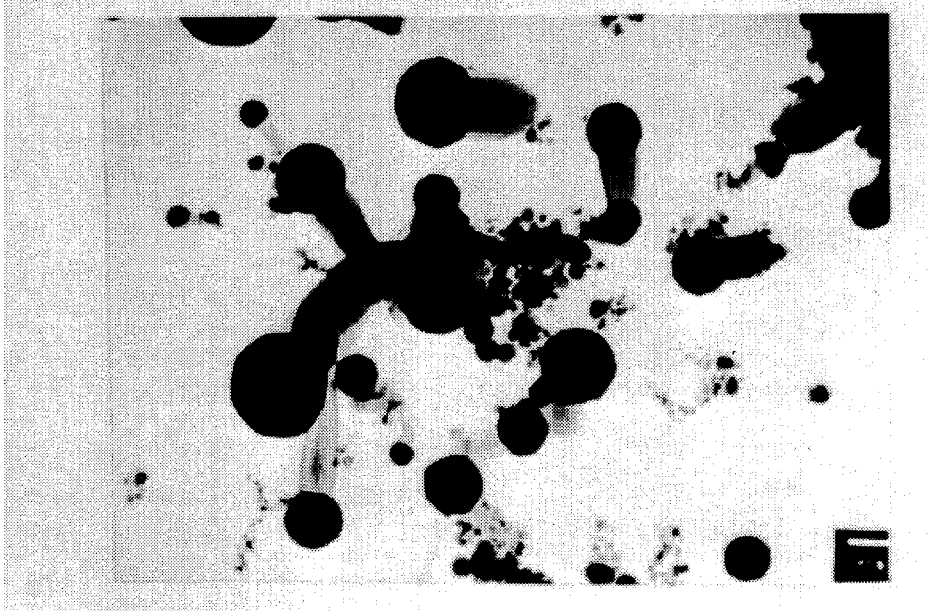
FIG. 6 is a transmission electron micrograph showing composite ultrafine particles produced by the use of a 25 at% Al-25 at% Cr-50 at% Co ternary alloy.

FIG. 6 is a transmission electron micrograph showing part of the ultrafine particles produced from the ternary alloy of the composition of 25 at% Al-25 at% Cr-50 at% Co mentioned above. It is clearly noted from this photograph that ultrafine particles containing a large amount of composite ultrafine particles of the structure having an ultrafine whiskery or columnar ceramic particle extended from an ultrafine polyhedral particle were produced with the matrix alloy of the composition of 25 at% Al-25 at% Cr-50 at% Co. By analysis, these composite ultrafine particles were concluded to be composite ultrafine particles of the structure having an ultrafine whiskery or columnar AlN particle extended from an ultrafine β—$Cr_2N$ (Co solid solution) particle.

EXAMPLE 3

Ultrafine particles were produced with a ternary alloy of a composition of 10 at% aluminum-10 at% chromium-80 at% iron as a matrix alloy by following the procedure of Example 1, namely by subjecting the matrix alloy to the arc melting (DC 200 A) in the atmosphere of nitrogen gas containing 4% of $H_2$ (with the partial pressure of nitrogen set at 300 Torr). The matrix alloy used herein had been obtained by melting aluminum, chromium, and iron with an arc and homogeneously alloying the melt in an atmosphere of argon within the same vacuum vessel as used for the production of ultrafine particles in the nitrogen atmosphere.

Ultrafine particles were similarly produced with ternary alloys of compositions of 5 at% Al-5 at% Cr-90 at% Fe, 25 at% Al-25 at% Cr-50 at% Fe, 30 at% Al-30 at% Cr-40 at% Fe, 40 at% Al-40 at% Cr-20 at% Fe, and 45 at% Al-45 at% Cr-10 at% Fe.

Figure 7:
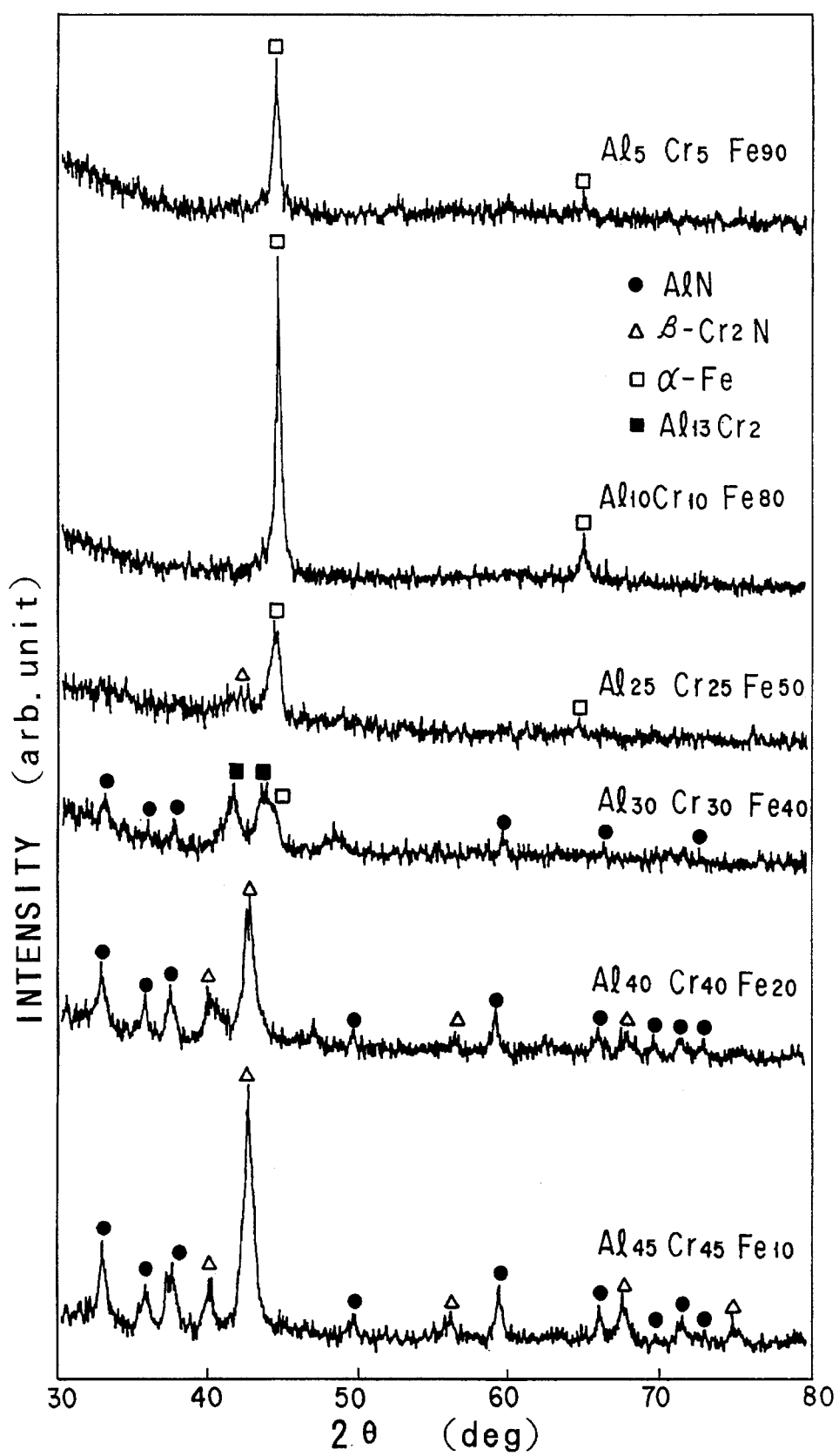
FIG. 7 is a diagram showing X-ray diffraction patterns of various ultrafine particles produced by the use of aluminum-chromium-iron ternary alloys varied in composition, as shifted in the direction of the vertical axis (intensity)
Figure 8:
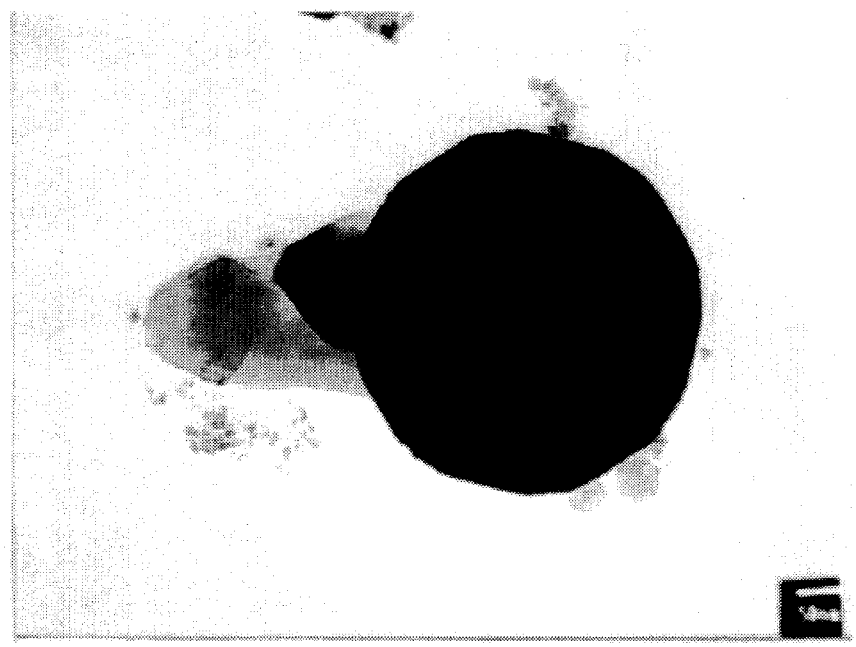
FIG. 8 is a transmission electron micrograph showing one of the composite ultrafine particles produced by the use of a 10 at% Al-10 at% Cr-80 at% Fe ternary alloy.

FIG. 7 shows the X-ray diffraction patterns of the ultrafine particles produced as described above, as shifted in the direction of the vertical axis (intensity). FIG. 8 is a transmission electron micrograph showing one of the composite ultrafine particles produced with the ternary alloy of the composition of 10 at% Al-10 at% Cr-80 at% Fe mentioned above.

It is clearly noted from the X-ray diffraction patterns shown in FIG. 7 and the transmission electron micrograph shown in FIG. 8 that the ultrafine particles produced with the Al—Cr—Fe ternary alloys as matrix alloys contained composite ultrafine particles of the structure having an ultrafine whiskery or columnar ceramic particle extended from an ultrafine polyhedral particle. By analysis, the composite ultrafine particles were concluded to be those of the structure having an ultrafine whiskery or columnar AlN particle extended from an ultrafine polyhedral particle formed of a solid solution of Cr in α—Fe where the matrix alloy had a composition of 10 at% Al-10 at% Cr-80 at% Fe, those of the structure having the ultrafine whiskery or columnar AlN particle extended from an ultrafine polyhedral particle formed of a solid solution of Fe in β—$Cr_2N$ where the matrix alloy had a composition of 45 at% Al-45 at% Cr-10 at% Fe, and those of the structure having the ultrafine whiskery or columnar AlN particle extended from an ultrafine polyhedral particle of an intermetallic compound where the matrix alloy had a composition of 30 at% Al-30 at% Cr-40 at% Fe. FIG. 7 does not show the peak of AlN because the X-ray diffraction had a too low level to describe any peak. The presence of AlN was confirmed, however, in the observation under a transmission electron microscope.

EXAMPLE 4

Ultrafine particles were produced with a binary alloy of a composition of 50 at% aluminum-50 at% cobalt as a matrix alloy by following the procedure of Example 1, namely by subjecting the matrix alloy to the arc melting (DC 200 A) in the atmosphere of nitrogen gas containing 4% of $H_2$ (with the partial pressure of nitrogen set at 300 Torr). The matrix alloy used herein had been obtained by melting aluminum and cobalt with an arc and homogeneously alloying the melt in an atmosphere of argon within the same vacuum vessel as used for the production of ultrafine particles in the nitrogen atmosphere.

Ultrafine particles were similarly produced with binary alloys of compositions of 10 at% Al-90 at% Co, 40 at% Al-60 at% Co, and 90 at% Al-10 at% Co as matrix alloys.

Figure 10:
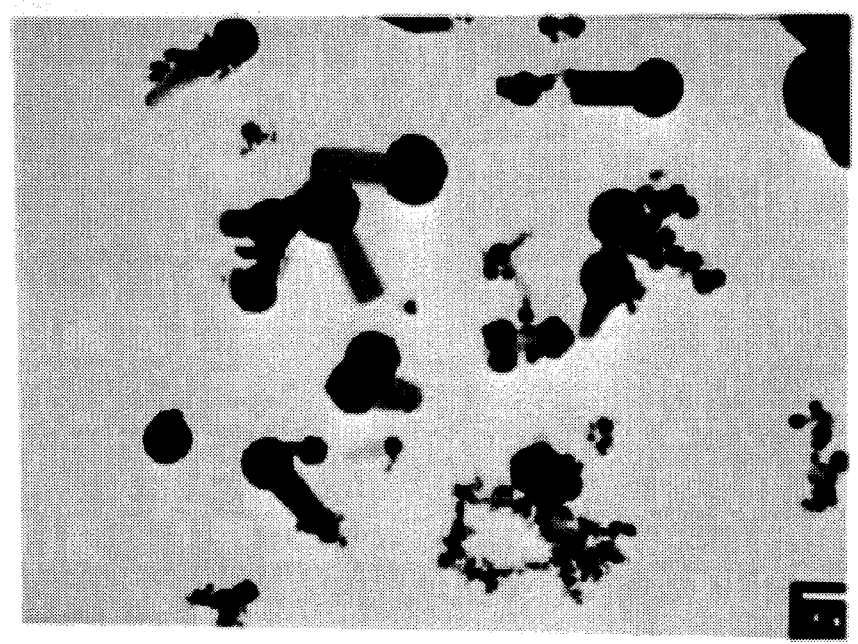
FIG. 10 is a transmission electron micrograph showing one of the composite ultrafine particles produced by the use of a 50 at% Al-50 at% Co binary alloy.
Figure 9:
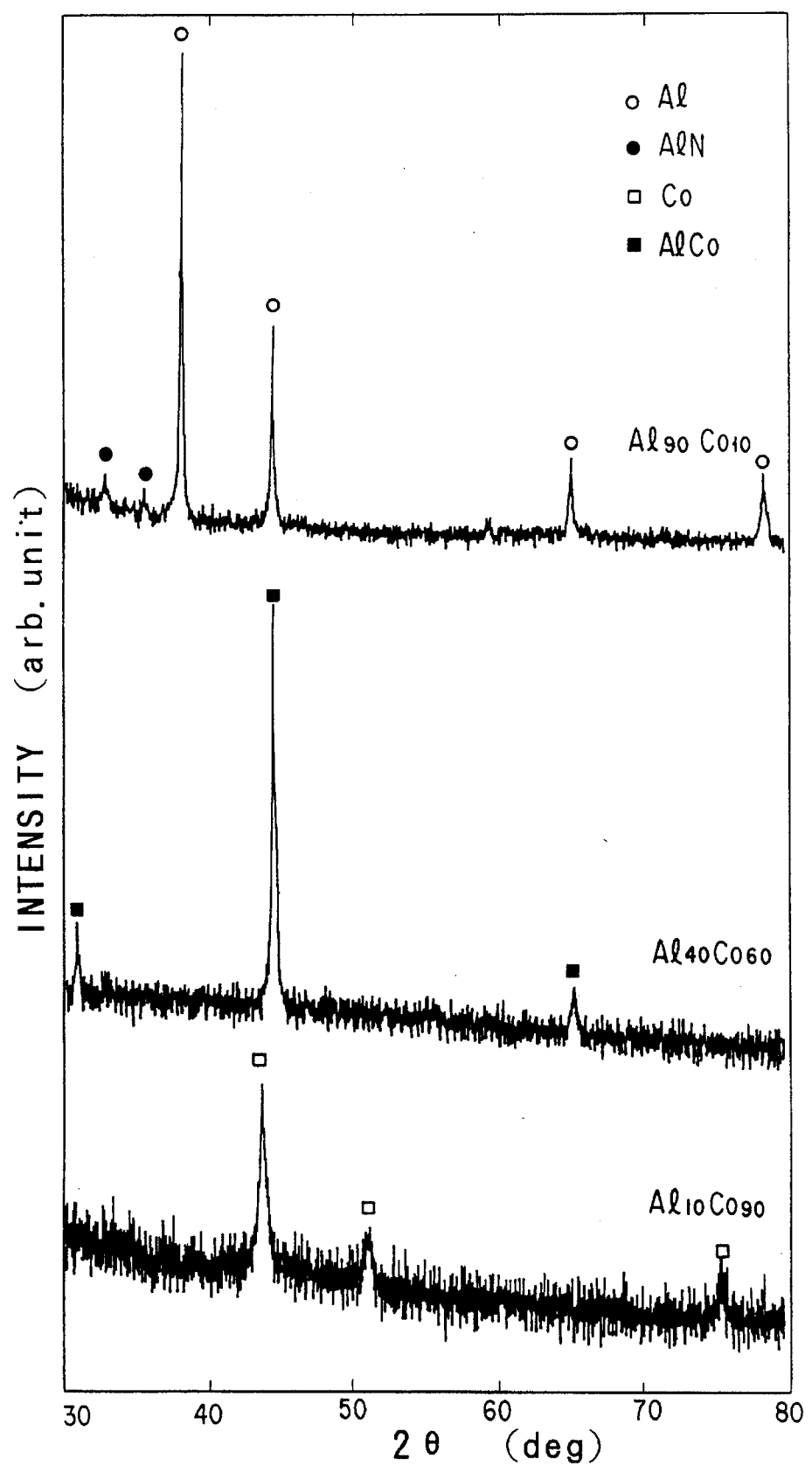
FIG. 9 is a diagram showing X-ray diffraction patterns of various ultrafine particles produced by the use of an aluminum-cobalt binary alloys in varying compositions, as shifted in the direction of the vertical axis (intensity)

FIG. 9 shows the X-ray diffraction patterns of the ultrafine particles produced as described above, as shifted in the direction of the vertical axis (intensity). FIG. 10 is a transmission electron micrograph showing part of the composite ultrafine particles produced with the binary alloy of the composition of 50 at% Al-50 at% Co mentioned above.

It is clearly noted from the X-ray diffraction patterns shown in FIG. 9 and the transmission electron micrograph shown in FIG. 10 that the ultrafine particles produced with the Al—Co binary alloys as matrix alloys contained a large amount of composite ultrafine particles of the structure having an ultrafine whiskery or columnar ceramic particle extended from an ultrafine polyhedral particle. By analysis, the composite ultrafine particles were concluded to be those of the structure having an ultrafine whiskery or columnar AlN particle extended from an ultrafine polyhedral particle formed of an intermetallic compound of Al—Co system where the matrix alloy had a composition of 50 at% Al-50 at% Co.

EXAMPLE 5

Ultrafine particles were produced with a binary alloy of a composition of 50 at% aluminum-50 at% iron as a matrix alloy by following the procedure of Example 1, namely by subjecting the matrix alloy to the arc melting (DC 200 A) in the atmosphere of nitrogen gas containing 4% of $H_2$ (with the partial pressure of nitrogen set at 300 Torr). The matrix alloy used herein had been obtained by melting aluminum and iron with an arc and homogeneously alloying the melt in an atmosphere of argon within the same vacuum vessel as used for the production of ultrafine particles in the nitrogen atmosphere.

Ultrafine particles were similarly produced with binary alloys of compositions of 10 at% Al-90 at% Fe, 40 at% Al-60 at% Fe, and 90 at% Al-10 at% Fe as matrix alloys.

Figure 11:
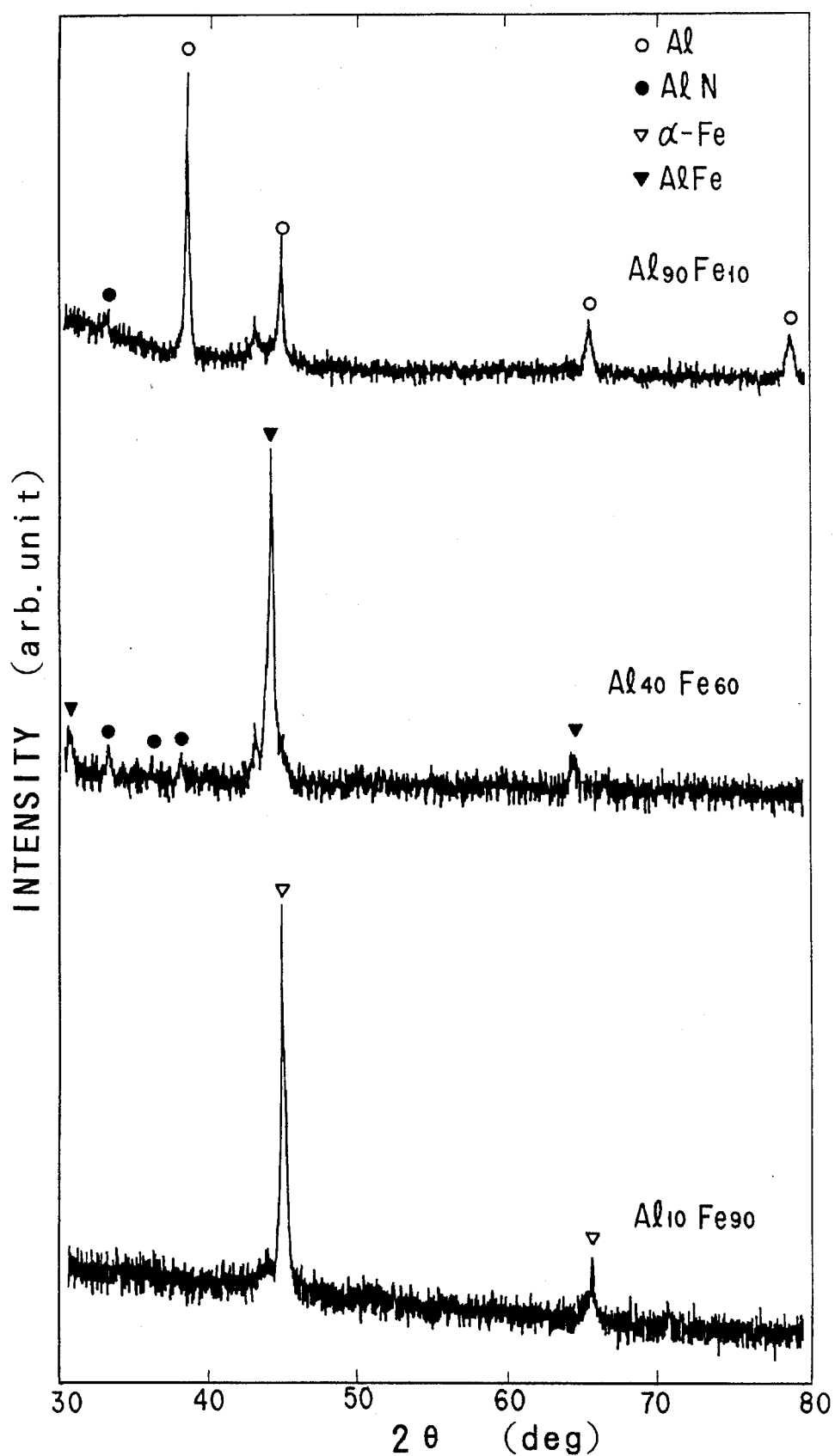
FIG. 11 is a diagram showing X-ray diffraction patterns of various ultrafine particles produced by the use of an aluminum-iron binary alloys in varying compositions, as shifted in the direction of the vertical axis (intensity)
Figure 12:
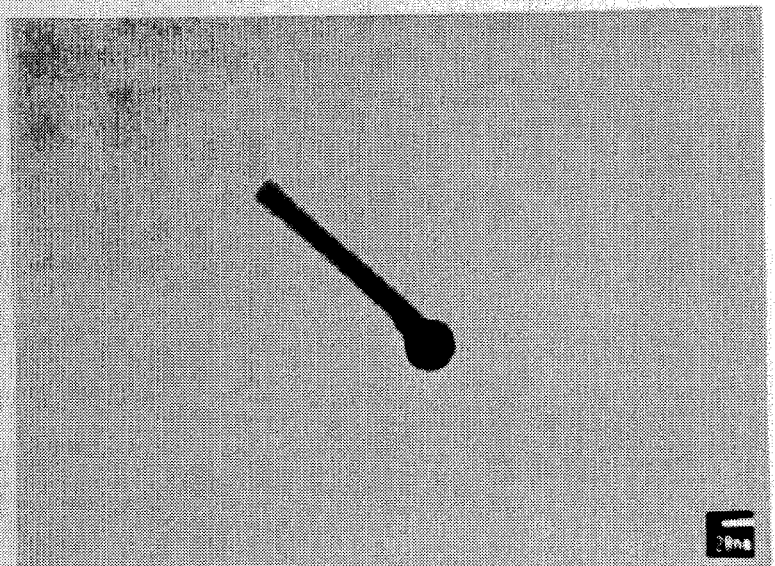
FIG. 12 is a transmission electron micrograph showing one of the composite ultrafine particles produced by the use of a 50 at% Al-50 at% Fe binary alloy.

FIG. 11 shows the X-ray diffraction patterns of the ultrafine particles produced as described above, as shifted in the direction of the vertical axis (intensity). FIG. 12 is a transmission electron micrograph showing one of the composite ultrafine particles produced with the binary alloy of the composition of 50 at% Al-50 at% Fe mentioned above.

It is clearly noted from the X-ray diffraction patterns shown in FIG. 11 and the transmission electron micrograph shown in FIG. 12 that the ultrafine particles produced with the Al—Fe binary alloys as matrix alloys contained a large amount of composite ultrafine particles of the structure having an ultrafine whiskery or columnar ceramic particle extended from an ultrafine polyhedral particle. By analysis, the composite ultrafine particles were concluded to be those of the structure having an ultrafine whiskery or columnar AlN particle extended from an ultrafine polyhedral particle formed of an intermetallic compound of Al—Fe system (FeAl or $Fe_3Al$) where the matrix alloy had a composition of 50 at% Al-50 at% Fe.

EXAMPLE 6

Ultrafine particles were produced with a ternary alloy of a composition of 25 at% aluminum-25 at% chromium-50 at% nickel as a matrix alloy by following the procedure of Example 1, namely by subjecting the matrix alloy to the arc melting (DC 200 A) in the atmosphere of nitrogen gas containing 4% of $H_2$ (with the partial pressure of nitrogen set at 300 Torr). The matrix alloy used herein had been obtained by melting aluminum, chromium, and nickel with an arc and homogeneously alloying the melt in an atmosphere of argon within the same vacuum vessel as used for the production of ultrafine particles in the nitrogen atmosphere.

Ultrafine particles were similarly produced with ternary alloys of compositions of 10 at% Al-10 at% Cr-80 at% Ni and 45 at% Al-45 at% Cr-10 at% Ni.

Figure 14:
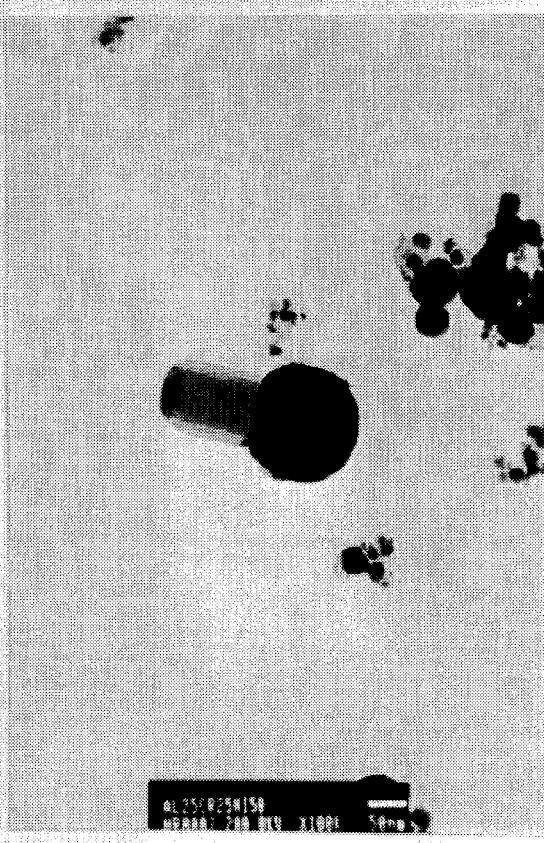
FIG. 14 is a transmission electron micrograph showing one of the composite ultrafine particles produced by the use of a 25 at% Al-25 at% Cr-50 at% Ni ternary alloy.
Figure 13:
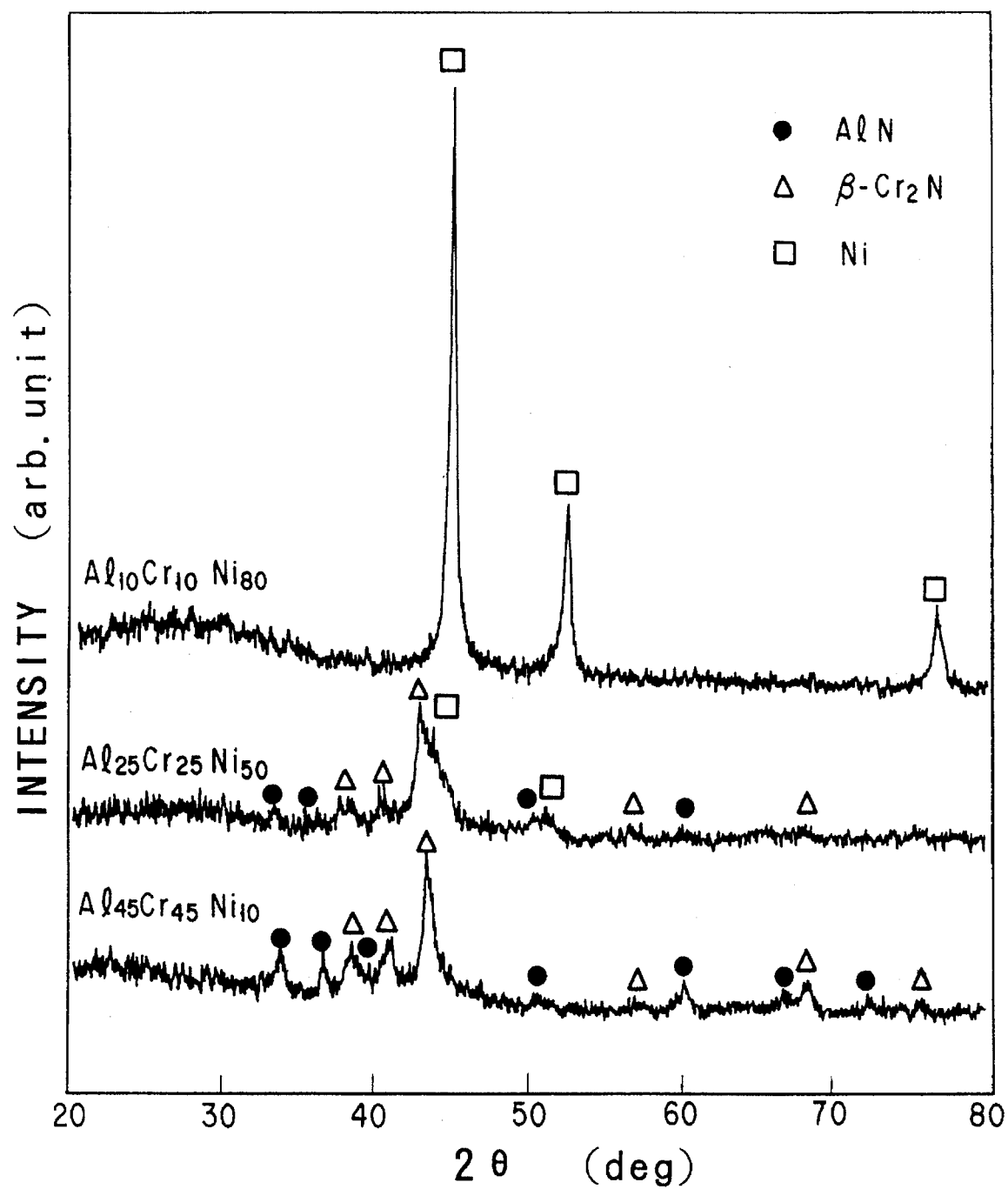
FIG. 13 is a diagram showing X-ray diffraction patterns of various ultrafine particles produced by the use of aluminum-chromium-nickel ternary alloys varied in composition, as shifted in the direction of the vertical axis (intensity)

FIG. 13 shows the X-ray diffraction patterns of the ultrafine particles produced as described above, as shifted in the direction of the vertical axis (intensity). FIG. 14 is a transmission electron micrograph showing part of the composite ultrafine particles produced with the ternary alloy of the composition of 25 at% Al-25 at% Cr-50 at% Ni mentioned above.

It is clearly noted from the X-ray diffraction patterns shown in FIG. 13 and the transmission electron micrograph shown in FIG. 14 that the ultrafine particles produced with the ternary alloy of a composition of 25 at% Al-25 at% Cr-50 at% Ni as a matrix alloy contained composite ultrafine particles of the structure having an ultrafine columnar ceramic particle extended from an ultrafine polyhedral particle. By analysis, the composite ultrafine particles were concluded to be those of the structure having an ultrafine columnar AlN particle extended from an ultrafine polyhedral particle formed of a solid solution of Cr in Ni.

EXAMPLE 7

Ultrafine particles were produced with a ternary alloy of a composition of 45 at% aluminum-45 at% chromium-10 at% manganese as a matrix alloy by following the procedure of Example 1, namely by subjecting the matrix alloy to the arc melting (DC 200 A) in the atmosphere of nitrogen gas containing 4% of $H_2$ (with the partial pressure of nitrogen set at 300 Torr). The matrix alloy used herein had been obtained by melting aluminum, chromium, and manganese with an arc and homogeneously alloying the melt in an atmosphere of argon within the same vacuum vessel as used for the production of ultrafine particles in the nitrogen atmosphere.

Ultrafine particles were similarly produced with a ternary alloy of a composition of 25 at% Al-25 at% Cr-50 at% Mn as a matrix alloy.

Figure 15:
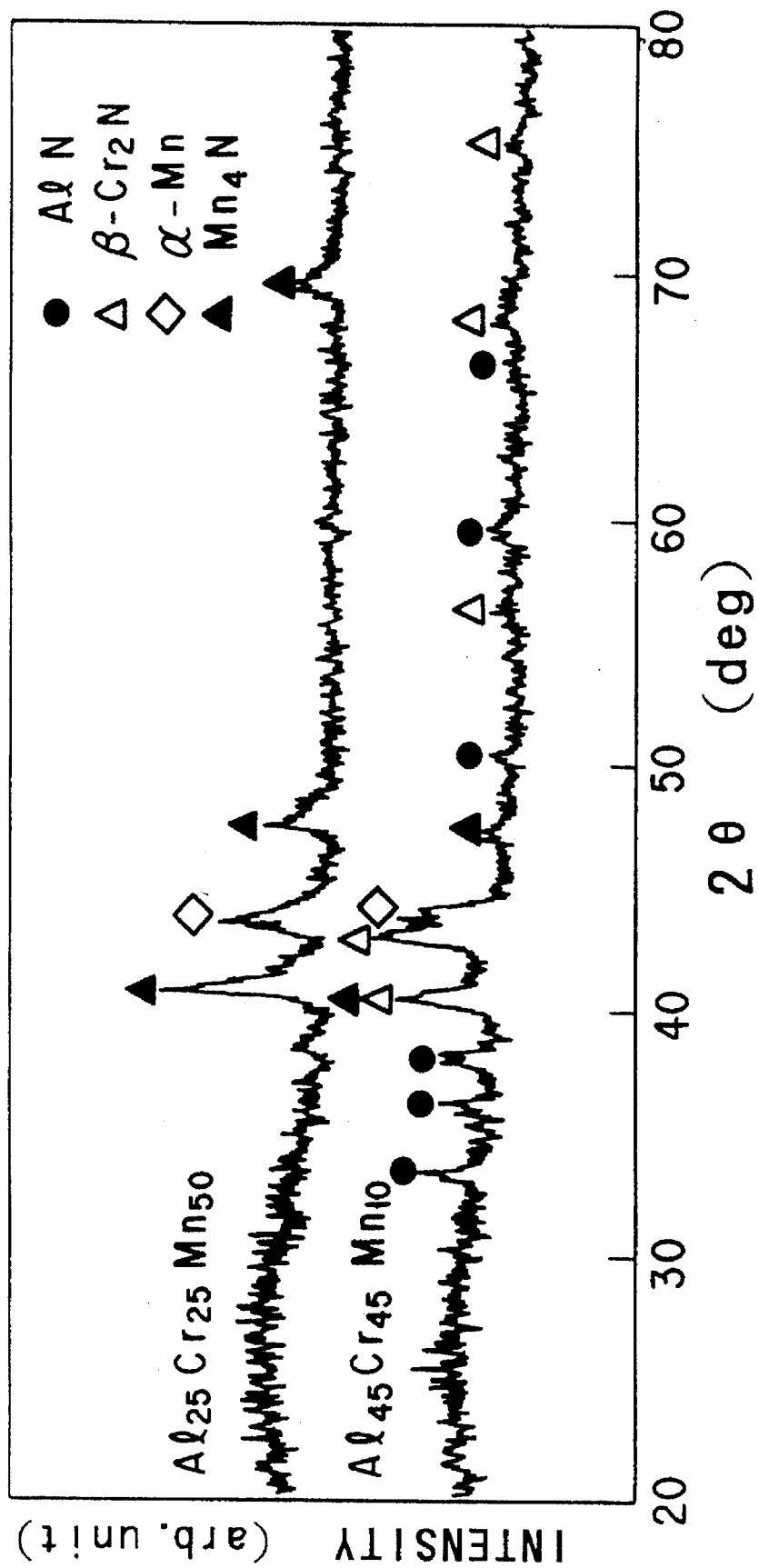
FIG. 15 is a diagram showing X-ray diffraction patterns of various ultrafine particles produced by the use of aluminum-chromium-manganese ternary alloys varied in composition, as shifted in the direction of the vertical axis (intensity)
Figure 16:
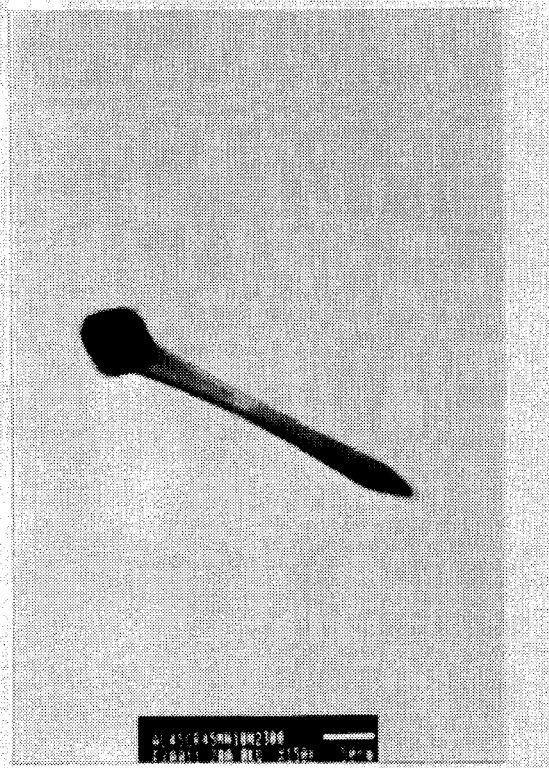
FIG. 16 is a transmission electron micrograph showing one of the composite ultrafine particles produced by the use of a 45 at% Al-45 at% Cr-10 at% Mn ternary alloy.

FIG. 15 shows the X-ray diffraction patterns of the ultrafine particles produced as described above, as shifted in the direction of the vertical axis (intensity). FIG. 16 is a transmission electron micrograph showing one of the composite ultrafine particles produced with the ternary alloy of the composition of 45 at% Al-45 at% Cr-10 at% Mn mentioned above.

It is clearly noted from the X-ray diffraction patterns shown in FIG. 15 and the transmission electron micrograph shown in FIG. 16 that the ultrafine particles produced with the ternary alloy of the composition of 45 at% Al-45 at% Cr-10 at% Mn contained composite ultrafine particles of the structure having an ultrafine whiskery or columnar ceramic particle extended from an ultrafine polyhedral particle. By analysis, the composite ultrafine particles were concluded to be those of the structure having an ultrafine whiskery or nail-shaped AlN particle extended from an ultrafine polyhedral particle formed of a solid solution of Cr in Mn. Where manganese was an element for addition to the Al—Cr alloy, the content of $Mn_4N$ in the produced ultrafine particles tended to increase when the Mn content in the matrix alloy was not decreased.

EXAMPLE 8

Ultrafine particles were produced with a ternary alloy having a composition of 25 at% aluminum-25 at% chromium-50 at% vanadium as a matrix alloy by following the procedure of Example 1, namely by subjecting the matrix alloy to the arc melting (DC 200 A) in the atmosphere of nitrogen gas containing 4% of $H_2$ (with the partial pressure of nitrogen set at 300 Torr). The matrix alloy used herein had been obtained by melting aluminum, chromium, and vanadium with an arc and homogeneously alloying the melt in an atmosphere of argon within the same vacuum vessel as used for the production of ultrafine particles in the nitrogen atmosphere.

Ultrafine particles were similarly produced with ternary alloys of different compositions of 10 at% Al-10 at% Cr-80 at% V and 45 at% Al-45 at% Cr-10 at% V as matrix alloys.

Figure 18:
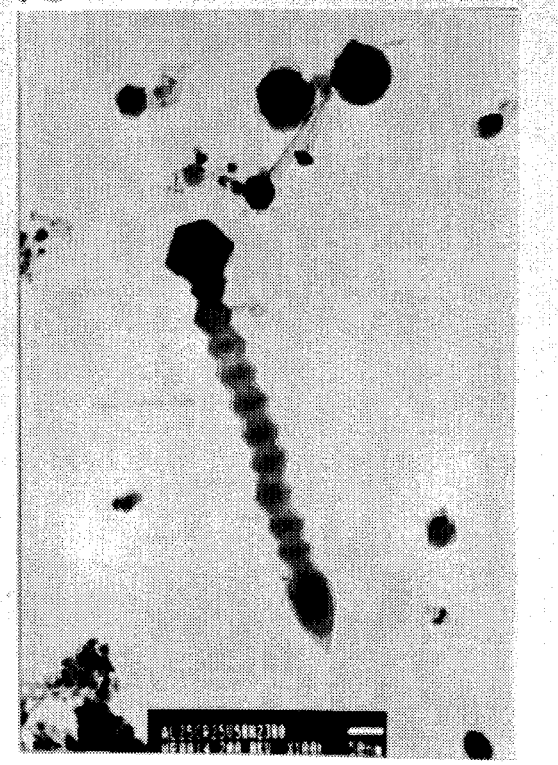
FIG. 18 is a transmission electron micrograph showing one of the composite ultrafine particles produced by the use of a 25 at% Al-25 at% Cr-50 at% V ternary alloy.
Figure 17:
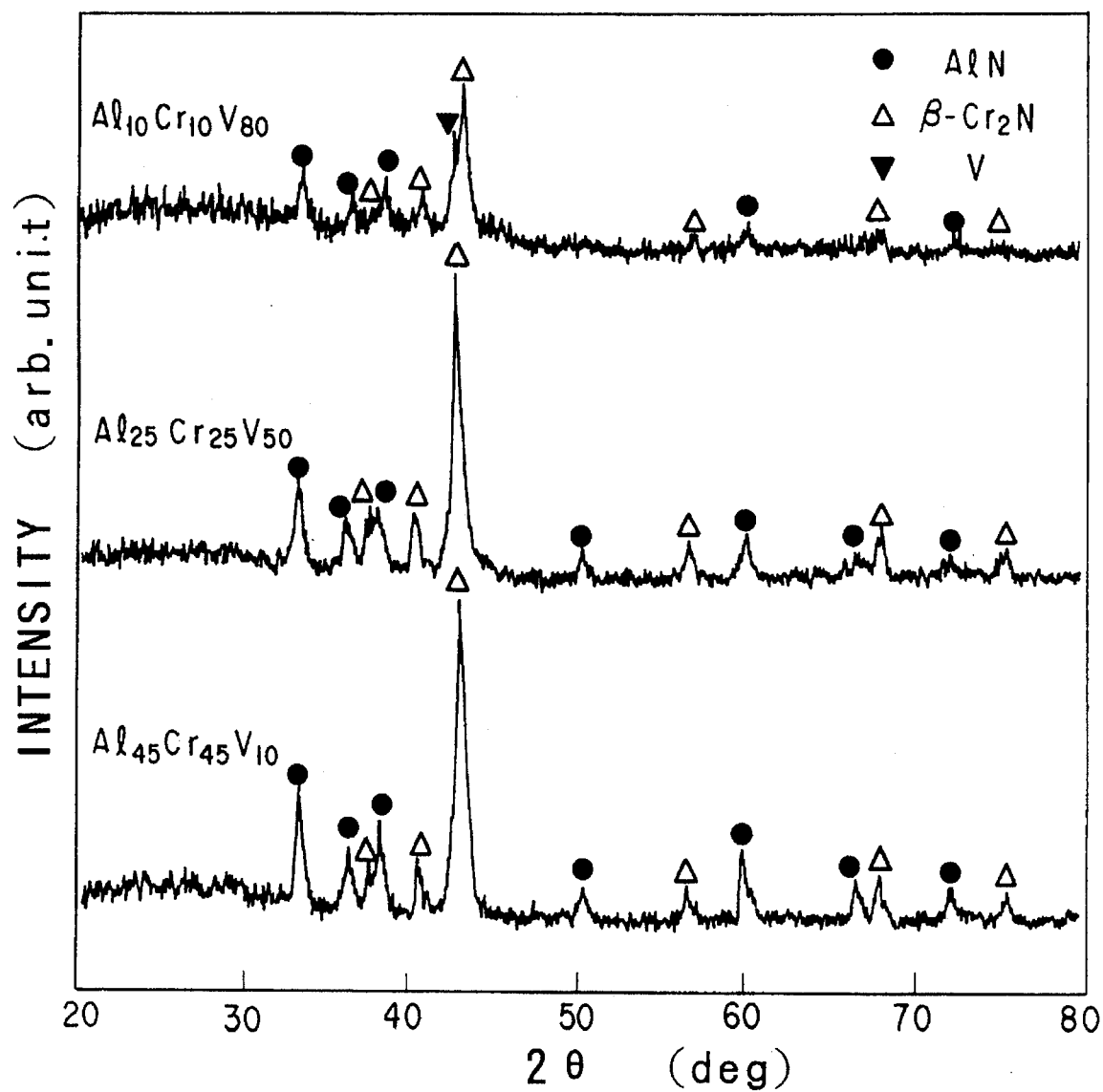
FIG. 17 is a diagram showing X-ray diffraction patterns of various ultrafine particles produced by the use of aluminum-chromium-vanadium ternary alloys varied in composition, as shifted in the direction of the vertical axis (intensity)

FIG. 17 shows X-ray diffraction patterns of the ultrafine particles produced as described above, as shifted in the direction of the vertical axis (intensity). FIG. 18 is a transmission electron micrograph showing part of the composite ultrafine particles produced with the ternary alloy of the composition of 25 at% Al-25 at% Cr-50 at% V mentioned above.

It is clearly noted from the X-ray diffraction patterns shown in FIG. 17 and the transmission electron micrograph shown in FIG. 18 that the ultrafine particles produced with the ternary alloy of the composition of 25 at% Al-25 at% Cr-50 at% V contained composite ultrafine particles of the structure having an ultrafine whiskery or bellows-like (or like a string of beads) ceramic particle extended from an ultrafine polyhedral particle. By analysis, these composite ultrafine particles were concluded to be those of the structure having an ultrafine whiskery or bellows-like AlN particle extended from an ultrafine polyhedral particle formed of a solid solution of V in $\beta$—$Cr_2N$. Where vanadium was an element for addition to the Al—Cr alloy, the produced ultrafine particles showed a trend of failing to produce composite ultrafine particles therein unless the V content in the matrix alloy was increased.

It will be clear from the working examples cited above that the method of the present invention attains a notably high nitriding ratio and, unlike the conventional method, are free from the drawback of giving rise to a large amount of ultrafine particles of elementary metal. Thus, the present invention allows efficient production of heretofore unattainable ultrafine ceramic particles which have a particle diameter of a nm order and contain in a large amount ultrafine composite nitride particles of the structure having an ultrafine whiskery or columnar aluminum nitride extended from an ultrafine metallic, intermetallic, or ceramic particle.

Further, the ultrafine particles obtained by the present invention are very slender whiskery or columnar ceramic particles of a particle diameter of a nm order. When a sintered article is obtained by sintering these ultrafine particles, therefore, the ultrafine particles lend themselves to the exaltation of sintering density and, at the same time, impart high hardness and strength to the sintered article. Besides, these ultrafine particles exhibit a high melting point ($\beta$—$Cr_2N$: 1,650° C., AlN: about 2,200° C.) because they contain a ceramic substance ($\beta$—$Cr_2N$, AlN). Since they exhibit excellent mechanical and physical properties such as hardness, strength, and resistance to heat, they can be utilized as a whisker dispersion material in various composite materials. They exhibit a piezoelectric property and, therefore, can be utilized as piezoelectric materials. They also find extensive utility as the blasting powder for surface processing, as the magnetic materials, and as other functional materials.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by foregoing description and all changes which come within the meaning and range of equivalency of the claims are, therefore, intended to be embraced therein.

What is claimed is:

1. An composite nitride particle of Al—$M^1$—N system, wherein $M^1$ stands for at least one metallic element selected from the group consisting of Cr, Co, and Fe, which particle having a whiskery or columnar structure formed of a composite phase of aluminum nitride and a substance selected from the group consisting of said metal, an intermetallic compound of said metal with aluminum, and a nitride ceramic of said metal.

2. An composite nitride particle according to claim 1, wherein said particle is possessed of a structure having an whiskery or columnar aluminum nitride extended from an particle of said metal.

3. An composite nitride particle according to claim 1, wherein said particle is possessed of a structure having an whiskery or columnar aluminum nitride extended from an particle of said intermetallic compound.

4. An composite nitride particle according to claim 1, wherein said particle is possessed of a structure having an whiskery or columnar aluminum nitride extended from an particle of said nitride ceramic.

5. An composite nitride particle according to claim 1, which is prepared from a binary alloy comprising from 25 to 75 atomic % of aluminum and from 25 to 75 atomic % of said $M^1$ element.

6. An composite nitride particle according to claim 1, which is prepared from a ternary alloy comprising from 5 to 95 atomic % of aluminum and from 5 to 95 atomic % of two metallic elements selected from the group consisting of Cr, Co, and Fe.

7. An composite nitride particle of Al—$M^1$—$M^2$—N system, wherein $M^1$ stands for at least one metallic element selected from the group consisting of Cr, Co, and Fe and $M^2$ for at least one metallic element selected from the group consisting of Au, Cu, Dy, Er, Ga, Ge, Gd, Hf, Ho, Lu, Mn, Mo, Nb, Nd, Ni, Pr, Re, Sb, Sc, Si, Sn, Ta, Tb, Ti, Tm, V, W, Y, Zn, and Zr, which particle having a whiskery or columnar structure formed of a composite phase of aluminum nitride and a substance selected from the group consisting of said metal, an intermetallic compound of said metal with aluminum, and a nitride ceramic of said metal.

8. An composite nitride particle according to claim 7, wherein said particle is possessed of a structure having an whiskery or columnar aluminum nitride extended from an particle of said metal.

9. An composite nitride particle according to claim 7, wherein said particle is possessed of a structure having an whiskery or columnar aluminum nitride extended from an particle of said intermetallic compound.

10. An composite nitride particle according to claim 7, wherein said particle is possessed of a structure having an whiskery or columnar aluminum nitride extended from an particle of said nitride ceramic.

11. An composite nitride particle according to claim 7, which is prepared from an alloy comprising from 5 to 45 atomic % of aluminum, from 5 to 45 atomic % of said $M^1$ element, and from 10 to 90 atomic % of said $M^2$ element.

12. An composite nitride particle according to claim 7, wherein said $M^1$ element is chromium and said $M^2$ element is nickel, manganese, or vanadium.

13. Nitride particles, comprising a mixture of whiskery or columnar aluminum nitride particles and particles selected from the group consisting of particles of at least one metal selected from the group consisting of Cr, Co, Fe, Au, Cu, Dy, Er, Ga, Ge, Gd, Hf, Ho, Lu, Mn, Mo, Nb, Nd, Ni, Pr, Re, Sb, Sc, Si, Sn, Ta, Tb, Ti, Tm, V, W, Y, Zn, and Zr, particles of an intermetallic compound of said metal with aluminum, and particles of a nitride ceramic of said metal.

14. Nitride particles according to claim 13, further comprising composite nitride particles which are possessed of a structure having a whiskery or columnar aluminum nitride extended from an particle of a substance selected from the group consisting of said metal, the intermetallic compound of said metal with aluminum, and the nitride ceramic of said metal.

15. Nitride particles according to claim 14, wherein said metal is selected from the group consisting of Cr, Co, and Fe.

16. Nitride particles according to claim 13, further comprising composite nitride particles of Al—$M^1$—$M^2$—N system, wherein $M^1$ stands for at least one metallic element selected from the group consisting of Cr, Co, and Fe and $M^2$ for at least one metallic element selected from the group consisting of Au, Cu, Dy, Er, Ga, Ge, Gd, Hf, Ho, Lu, Mn, Mo, Nb, Nd, Ni, Pr, Re, Sb, Sc, Si, Sn, Ta, Tb, Ti, Tm, V, W, Y, Zn, and Zr, said particles being possessed of a structure having a whiskery or columnar aluminum nitride extended from an particle of a substance selected from the group consisting of said metal, the intermetallic compound of said metal with aluminum, and the nitride ceramic of said metal.

17. Nitride particles according to claim 16, wherein said $M^1$ element is chromium and said $M^2$ element is nickel, manganese, or vanadium.

18. A composite nitride particle according to claim 1, wherein said particle has a particle diameter of not more than 1000 nm.

* * * * *

UNITED STATES PATENT AND TRADEMARK OFFICE
CERTIFICATE OF CORRECTION

PATENT NO. : 5,549,951
DATED : August 27, 1996
INVENTOR(S) : Tadashi YAMAGUCHI et al.

It is certified that error appears in the above-indentified patent and that said Letters Patent is hereby corrected as shown below:

Title page, column 1, lines 5-6 (lines 2-3 under "Inventors"), "Inoue Akihisa" should read --Akihisa Inoue--.

Title page, column 1, line 16 (line 3 under "Assignees"), "Miyagi-ken" should read --Sendai--.

Claim 1, column 15, line 19, "An" should read --A--.

Claim 2, column 15, line 27, "An" should read --A--;
line 28, "an" should read --a--;
line 29, "an" should read --a--.

Claim 3, column 15, line 31, "An" should read --A--;
line 32, "an" should read --a--;
line 33, "an" should read --a--.

Claim 4, column 15, line 35, "An" should read --A--;
line 36, "an" should read --a--;
line 37, "an" should read --a--.

UNITED STATES PATENT AND TRADEMARK OFFICE
CERTIFICATE OF CORRECTION

PATENT NO. : 5,549,951

DATED : August 27, 1996

INVENTOR(S) : Tadashi YAMAGUCHI et al.

It is certified that error appears in the above-indentified patent and that said Letters Patent is hereby corrected as shown below:

Claim 5, column 15, line 39, "An" should read --A--.

Claim 6, column 15, line 43, "An" should read --A--.

Claim 7, column 15, line 48, "An" should read --A--.

Claim 8, column 16, line 1, "An" should read --A--;
                              line 2, "an" should read --a--;
                              line 3, "an" should read --a--.

Claim 9, column 16, line 5, "An" should read --A--;
                              line 6, "an" should read --a--;
                              line 7, "an" should read --a--.

Claim 10, column 16, line 9, "An" should read --A--;
                               line 10, "an" should read --a--;
                               line 11, "an" should read --a--.

Claim 11, column 16, line 13, "An" should read --A--.

UNITED STATES PATENT AND TRADEMARK OFFICE
CERTIFICATE OF CORRECTION

PATENT NO. : 5,549,951
DATED : August 27, 1996
INVENTOR(S) : Tadashi YAMAGUCHI et al.

It is certified that error appears in the above-indentified patent and that said Letters Patent is hereby corrected as shown below:

Claim 12, column 16, Line 18, "An" should read --A--.

Claim 14, column 16, line 32, "an" should read --a--.

Claim 16, column 16, line 48, "an" should read --a--.

Signed and Sealed this

Fifteenth Day of April, 1997

Attest:

BRUCE LEHMAN

Attesting Officer

Commissioner of Patents and Trademarks